United States Patent
Trammell et al.

(10) Patent No.: US 6,889,813 B1
(45) Date of Patent: May 10, 2005

(54) MATERIAL TRANSPORT METHOD

(75) Inventors: Harold L. Trammell, Colleyville, TX (US); Robert H. Bond, Plano, TX (US)

(73) Assignee: Amkor Technology, Inc., Chandler, AZ (US)

( * ) Notice: Subject to any disclaimer, the term of this patent is extended or adjusted under 35 U.S.C. 154(b) by 534 days.

(21) Appl. No.: 09/602,162

(22) Filed: Jun. 22, 2000

(51) Int. Cl.$^7$ .......................... B65G 37/00; B65G 49/07
(52) U.S. Cl. ................. 198/346.3; 198/750.11; 414/940
(58) Field of Search .................. 198/468.2, 750.11, 198/346.3; 414/937, 938, 940, 941

(56) References Cited

U.S. PATENT DOCUMENTS

| | | |
|---|---|---|
| 482,861 A | 9/1892 | Burns |
| 601,670 A | 4/1898 | McMyler et al. |
| 612,413 A | 10/1898 | Guernsey et al. |
| 2,501,768 A | 3/1950 | Fones |
| 2,543,379 A | 2/1951 | Richardson |
| 3,540,603 A | 11/1970 | Neumeier |
| 3,563,179 A | 2/1971 | Gorjanc |
| 3,612,297 A | 10/1971 | Lapostolet |
| 3,696,596 A | 10/1972 | Wegscheid |
| 3,727,968 A | 4/1973 | Tsuchihashi et al. |
| 3,765,533 A | 10/1973 | Stephens et al. |
| 4,037,730 A | 7/1977 | Fetzer et al. |
| 4,289,076 A | 9/1981 | Miller |
| 4,294,682 A | 10/1981 | Deczky |
| 4,372,452 A | 2/1983 | McCord |
| 4,496,063 A | 1/1985 | Ishii et al. |
| 4,577,513 A | 3/1986 | Harwood et al. |
| 4,591,044 A * | 5/1986 | Ogami et al. ............. 198/346.3 |
| 4,638,231 A | 1/1987 | Monforte |
| 4,738,022 A | 4/1988 | Sakamoto et al. |
| 4,816,732 A | 3/1989 | Wilson |
| 4,818,173 A | 4/1989 | Khusro |
| 4,894,849 A | 1/1990 | Rohosky et al. |
| 4,904,153 A | 2/1990 | Iwasawa et al. |
| 4,926,753 A | 5/1990 | Weiss |
| 4,973,219 A | 11/1990 | Brickner et al. |
| 4,974,166 A | 11/1990 | Maney et al. |
| 4,979,360 A | 12/1990 | Kallmann et al. |
| 5,018,936 A | 5/1991 | Izumi et al. |
| 5,062,760 A | 11/1991 | Samaniego |
| 5,097,421 A | 3/1992 | Maney et al. |
| 5,166,884 A | 11/1992 | Maney et al. |
| 5,177,434 A | 1/1993 | Suzuki et al. |
| 5,203,265 A | 4/1993 | Nii et al. |
| 5,213,045 A | 5/1993 | Gersemsky |
| 5,271,628 A * | 12/1993 | Okada ....................... 273/448 |
| 5,280,715 A | 1/1994 | Baldwin |
| 5,370,216 A | 12/1994 | Tsuruyama |
| 5,440,943 A | 8/1995 | Holt et al. |

(Continued)

*Primary Examiner*—D. Glenn Dayoan
*Assistant Examiner*—G Blankenship
(74) *Attorney, Agent, or Firm*—Gunnison, McKay & Hodgson, L.L.P.; Serge J. Hodgson

(57) ABSTRACT

A controlled material transport method for carrying materials to and from workstations, test equipment, and processing and assembly tools in a common facility. The present invention includes a rigid "robot vehicle" mountable to a passive track system, which can be routed to service all processing tools on the factory floor. The robot vehicle includes a hoist assembly and gripper assembly, which together perform such functions as picking up magazines, placing magazines, and loading magazines into the processing tools. The hoist assembly is capable of functioning in an operational envelope, which includes any target location within a 3-axis Cartesian coordinate system, to the extent of the range of motion of the hoist assembly. The hoist assembly also provides rigid and controlled z-axis travel, while being compact when retracted. The gripper assembly facilitates loading of the magazines, especially chute style magazines, which are commonly found on many existing processing tools.

38 Claims, 23 Drawing Sheets

U.S. PATENT DOCUMENTS

| | | |
|---|---|---|
| 5,450,796 A | 9/1995 | Sakagami |
| 5,570,990 A | 11/1996 | Bonora et al. |
| 5,622,470 A | 4/1997 | Schaefer et al. |
| 5,673,804 A | 10/1997 | Weiss et al. |
| 5,687,831 A | 11/1997 | Carlisle |
| 5,701,824 A | 12/1997 | Johnson et al. |
| 5,741,109 A | 4/1998 | Wiesler et al. |
| 5,749,693 A * | 5/1998 | Hanaya .................. 414/277 |
| 5,941,678 A | 8/1999 | Saito |
| 5,944,940 A | 8/1999 | Toshima |
| 5,980,183 A | 11/1999 | Fosnight |
| 6,003,655 A | 12/1999 | Tanaka et al. |
| 6,058,849 A | 5/2000 | Ostholt et al. |
| 6,079,927 A | 6/2000 | Muka |
| 6,092,678 A | 7/2000 | Kawano et al. |
| 6,138,694 A | 10/2000 | Hansen et al. |
| 6,205,930 B1 | 3/2001 | Waedekin |
| 6,230,911 B1 | 5/2001 | Zakula, Sr. et al. |
| 6,241,065 B1 | 6/2001 | Kohlenberg et al. |
| 6,293,750 B1 | 9/2001 | Cohen et al. |
| 6,315,513 B1 | 11/2001 | Harukawa et al. |
| 6,336,546 B1 | 1/2002 | Lorenz |
| 6,419,071 B1 * | 7/2002 | Oldford et al. .......... 198/345.3 |
| 6,450,318 B1 * | 9/2002 | Minardi .................. 198/346.3 |
| 6,530,735 B1 | 3/2003 | Trammell |
| 6,695,120 B1 | 2/2004 | Trammell |

* cited by examiner

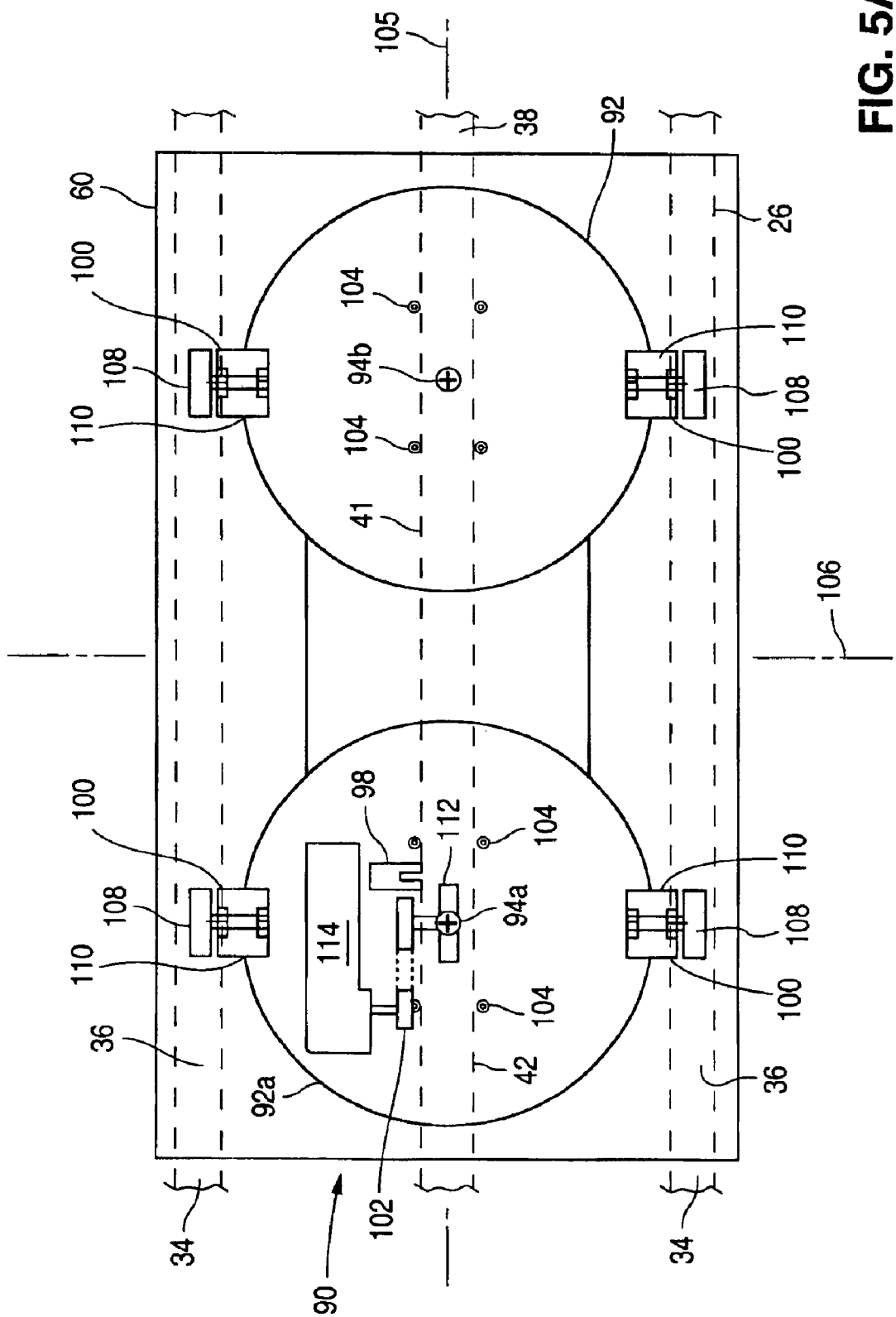

MATERIAL TRANSPORT METHOD

BACKGROUND OF THE INVENTION

1. Field of the Invention

The present invention generally relates to a material handling system, and more particularly, to a controlled system for moving materials to various locations within a manufacturing facility.

2. Description of the Related Art

To remain competitive in the manufacturing industry, manufacturers are constantly seeking out new ways to increase productivity. Advances in technology have helped to increase productivity by providing numerically controlled devices, which allow for the introduction of automated manufacturing equipment. One of the most significant advances in technology for increasing productivity has been the introduction of computers to the manufacturing floor. Computers have made it possible to accurately monitor and track production systems so manufacturers can adapt more quickly to production demands. Computers also facilitate the use of robots. Robots allow for the real-time adaptation of the manufacturing environment to the demands of the production process. Generally, robots are used to transport materials around a factory floor to deliver items to, and remove items from, various process tools.

Robots require some way to present parts or material to and from the various types of processing equipment which they service. For example, one of the most common material transport systems, is an overhead lift system. In this example, the overhead lift system uses a platform suspended by suspension mechanisms, such as ropes, cables, wires, chains, belts, and the like, which are reeled up or down to raise or lower the platform. Unfortunately, in this system the ability to pick or place material at a given point is greatly limited due to lack of positional control of the material when the system lowers it due to side swaying and/or twisting. Also, the suspended transport system typically requires that the suspension mechanisms be reeled up and/or down, in unison, at the same rate, to prevent tilting of the carrier platform. This Requirement usually only met using carefully designed spooling mechanisms or other complex components. Further, most suspended transport systems fail to provide off-axis loading, which limits their usefulness.

An inline tool system for the automatic processing and/or automatic treatment of materials is yet another example of a common type of material transport system. FIGS. 1A and 1B are illustrations of a perspective and side view, respectively, of the inline system, which may include front-of-line (FOL) and/or back-of-line (BOL) tools. The FOL and BOL tools are used to treat and/or process semiconductor chips. The chips are typically contained in magazines M when they are transported. The magazines M are fed to the tools and prepared therein for processing or treatment and also for transporting away after the processing or treatment.

Arranged behind the line of tools, is a rail device T, on which runs a robot R, which grips, moves, positions and releases the magazines M as required. As shown in FIG. 1B, the mounting robot R travels rectilinearly and horizontally on the rail device T. A gripper G for the magazine M is supported movably on the mounting robot R by means of an advancing carriage V and a lifting carriage H. The advancing carriage V is movable on the mounting robot R horizontally and orthogonally to the rail device T towards one of the tools and away from it. The lifting carriage H is movable vertically on the advancing carriage V. Consequently, the gripper G can be moved with three Cartesian degrees of freedom or directions of movement with respect to the tools in order to bring the magazine M to the intended magazine position at the tool and unload it there, or to grip it there and lead it away.

The drawbacks to the above-described system are many. Foremost, as illustrated in FIG. 1B, rail device T of the inline system can require two feet or more of floor space, which can present a total space penalty of up to 30% on most factory floors. If the floor space includes clean room floor space, the cost associated with such a floor space penalty can be dramatically increased. Moreover, the inline system is not flexible in routing so that service can only be provided along a straight path.

The modern factory uses many different types of processing tools and equipment, some of which can be older existing equipment (i.e., legacy equipment), which may not be designed for the inline system of loading (e.g., rear loading). Instead, most legacy equipment is designed for front loading, typically via a loading chute. Thus, another drawback of most typical transport systems is that they are designed for rear loading and are thus not capable of chute loading. Most transport systems are also typically not flexible enough to support cell-to-cell transport or functional layout. Consequently, to implement a modern transport system in an existing factory may require the buying of new equipment and/or the making of expensive factory and equipment modifications.

For the above reasons, what is needed is a material transport system which can transport materials from one processing station or tool to another, in a rigid and controlled manner, while having flexibility in routing, and compactability for efficient space utilization.

SUMMARY OF THE INVENTION

The present invention provides a controlled material transport system (MTS) for carrying materials to and from, for example, work stations, test equipment, and processing and assembly tools in a common facility. The system of the present invention can deliver and/or remove material or payloads (e.g., semiconductor chips carried in magazines) directly to and/or from processing and assembly tools using a highly integrated vehicle running on a simple passive track system. The MTS of the present invention can load/unload magazines from any processing tool that can be serviced vertically from above.

The MTS of the present invention includes a rigid robot vehicle mountable to the passive track system, which can be routed to service all processing tools on the factory floor. The robot vehicle can handle and transport the magazines in much the same manner as an operator, which facilitates the loading of the processing tools and processing tool chutes without requiring modification to the processing tools. The MTS includes a hoist assembly and gripper assembly, which together perform such functions as picking up magazines, placing magazines, and loading magazines into the processing tools.

Advantageously, the hoist assembly is capable of functioning in an operational envelope, which includes any target location within a 3-axis Cartesian coordinate system, to the extent of the range of motion of the hoist assembly. The hoist assembly also provides rigid and controlled z-axis travel (i.e. vertical), while being compact when retracted. The compactness of the retracted hoist assembly improves factory space utilization and permits use of the MTS in low-ceiling environments. The gripper assembly facilitates loading of the magazines, especially chute style magazines, which are commonly found on many existing processing tools.

The control responsibilities for the MTS are divided into two distinct functions. The MTS controller (MTSC) manages the scheduling of the vehicle actions while the vehicle controller (VC) controls the actions of the vehicle. The interface between the MTSC and the VC may be wireless, for example, through RF or IR communication links. Power rails in the tracks provide power to the vehicle.

In one aspect of the invention a method is provided for transporting material between various locations on a factory floor. The method includes moving a rail mounted vehicle proximate to a first location; actuating a material handling mechanism to deploy a handling device for grasping material to be transported; and moving the material from the first location to a second location.

The MTS economically services assembly tools without major changes to the assembly floor layout, which makes it possible to preserve valuable factory floor space and does not require redesign of present factory floors. Moreover, the back-to-back layout of the FOL and BOL tools can be preserved. The MTS of the present invention is also cost effective for assembly and test manufacturing, since it can be implemented in existing factory floors with little or no modification. The MTS is also flexible in that assembly tools or processing stations can be moved, changed, and/or upgraded with minimal impact to the MTS.

Other uses, advantages, and variations of the present invention will be apparent to one of ordinary skill in the art upon reading this disclosure and accompanying drawings.

BRIEF DESCRIPTION OF THE DRAWINGS

FIGS. 5A and 5B are simplified illustrations of an embodiment of a drive system in accordance with the present invention;

DETAILED DESCRIPTION

Figure 1A:
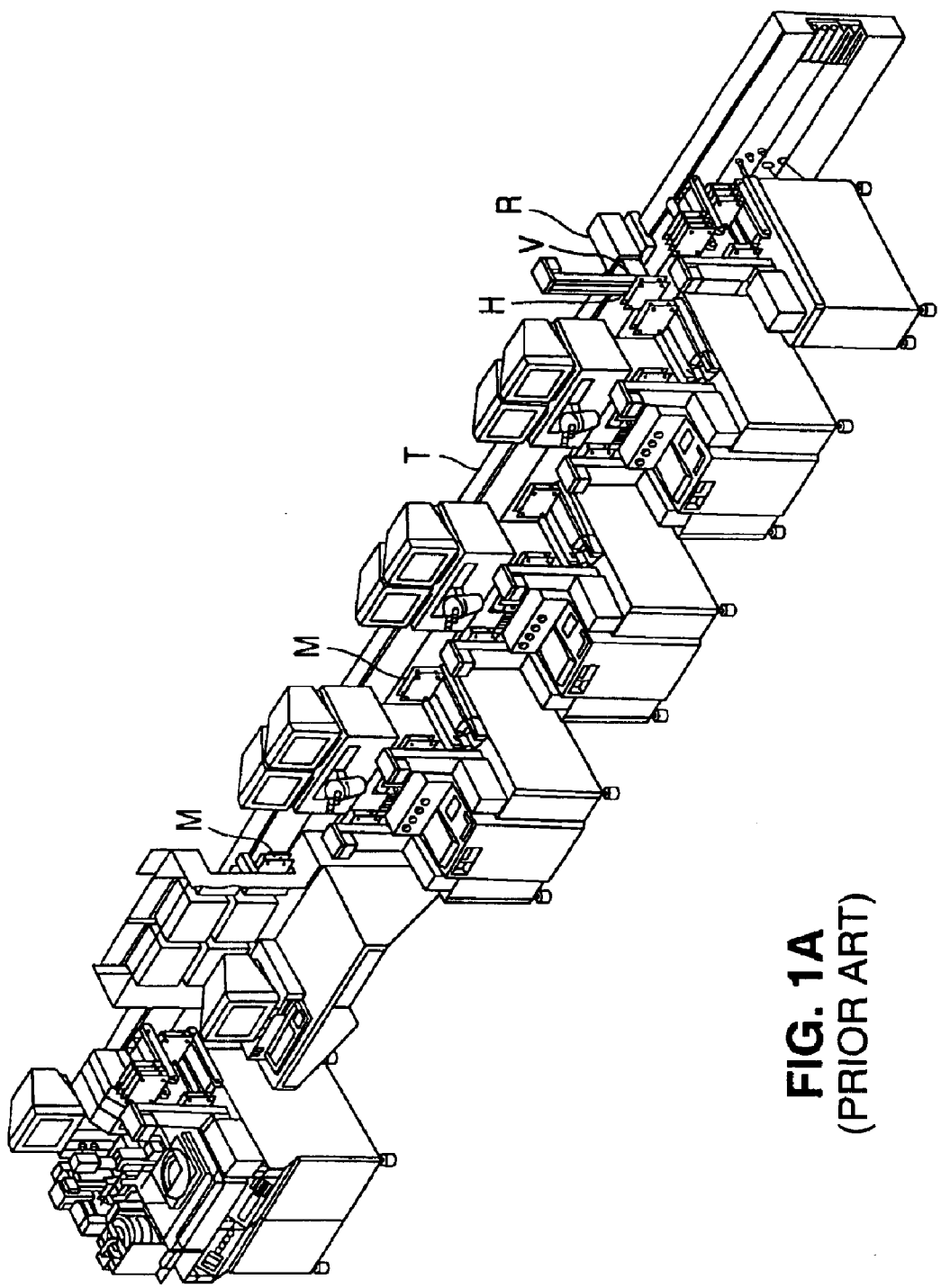
FIG. 1A is a perspective view of a typical material transport system with processing tools and equipment.
Figure 1B:
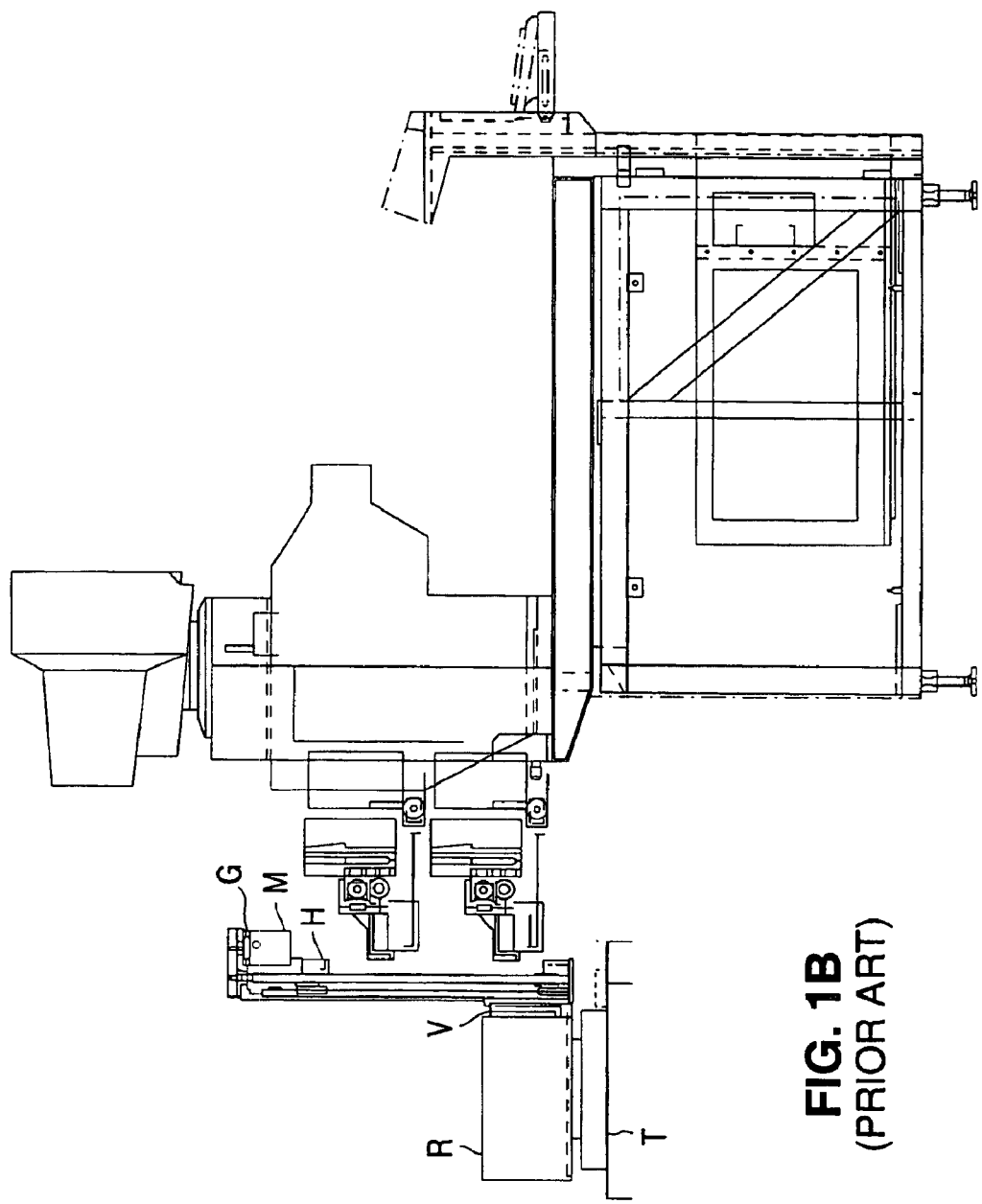
FIG. 1B is a side view of the embodiment of FIG. 1A.

The material transport system (MTS) of the present invention is designed to transport materials or payloads to various locations in a plant, factory, or other common facility (hereinafter "factory"). The materials to be transported may be any materials or payloads, such as those that can undergo automatic processing and/or automatic treatment. Typically, the materials and payloads include semiconductor chip filled magazines (hereinafter "magazines"). As will be appreciated from the description that follows, with no intent to limit the invention thereby, the MTS is an overhead or ceiling mounted system for transporting magazines to FOL, BOL, and test equipment, such as die bonders, and/or wire bonders for establishing electrical connections on chips; continuous furnaces for the curing of plastics; and devices for the intermediate storage of the chips, backgrinders, tape cutters, and trim and form tools (hereinafter collectively "processing tools"). As an overhead system, the MTS uses space which typically goes unused in many semiconductor chip-manufacturing plants.

To improve the clarity of illustration by showing all the relevant parts of the various embodiments, it should be understood that the figures provide a functional representation of the embodiments and therefore do not necessarily depict actual parts, structures, or parts placement. Accordingly, the invention is not limited to the parts, structures, and parts placement shown in the figures. In the various figures like reference numerals refer to like parts.

Figure 2:
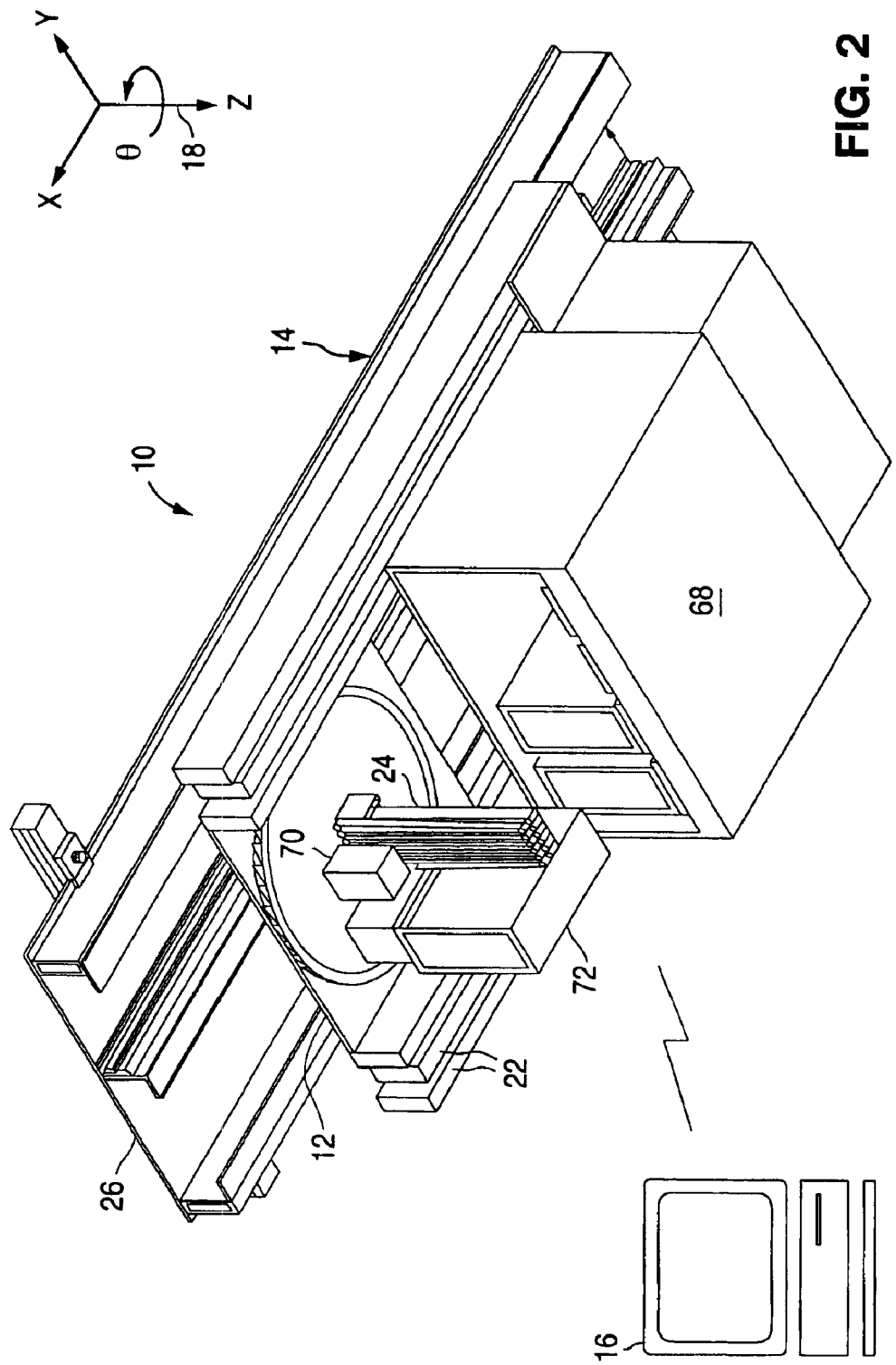
FIG. 2 is a perspective view of a material transport system in accordance with the present invention.

FIG. 2 is a perspective view of MTS 10 in accordance with the present invention. Generally, MTS 10 includes a vehicle assembly 12 mounted to a serpentine and/or straight line overhead rail system 14. Vehicle assembly 12 is capable of servicing substantially all processing tools on a factory floor under the direction of a central controller 16, depicted as a computer having a keyboard and a monitor.

As shown in FIG. 2, vehicle assembly 12 can be an electrically powered, rigid robot vehicle that is capable of picking up, transporting, and delivering magazines 72 to processing tools found on the factory floor. To provide this capability, vehicle assembly 12 includes an extendible member assembly 22, which provides vehicle assembly 12 with an extension capability in the xy-plane. A hoist assembly 24, can be located at the extendible end of vehicle assembly 12, such that it can be positioned over magazine 72, and then raised, or lowered, in the z-direction to deliver, or take away, magazine 72 to, or from, a processing tool. At an end of hoist assembly 24 is a gripper assembly 23 (referenced below as 200), which provides a grasping capability to the invention. Vehicle assembly 12 also includes a storage unit 68, which allows a plurality of magazines 72 to be stored during transport.

Vehicle assembly 12 moves upon rail system 14, which provides the guideway or road on which vehicle assembly 12 transports the magazines. Rail system 14, described in greater detail below, may be composed of a plurality of inter-connected modular sections or tracks 26. Modular track sections 26 may be placed in any configuration to allow for optimum flexibility and efficiency in magazine routing by establishing a desired path for assembly vehicle 12 to take to the desired processing tool location. The modularity of tracks 26 makes it possible to add, remove, or relocate a processing tool or otherwise modify the layout of the factory floor and still be able to service all processing tools.

Central controller 16 provides the management of the operation of MTS 10 (FIG. 2). As described in greater detail below, central controller 16 can perform management tasks, which may include, the directing of vehicle actions, the scheduling of vehicle actions, and the relaying of vehicle routing instructions to vehicle controller 70 (FIG. 2). Generally, central controller 16 can communicate with vehicle assembly 12 via the vehicle controller through an IR or RF communication link.

MTS 10 can perform five motions in a 3-axis environment 18, where the x-axis is along the direction of the track; the y-axis transverse to the direction of the track; and the z-axis perpendicular to the xy-plane. The rotational orientation of the transported material in the xy-plane, is represented by θ. Vehicle assembly 12 is rotatable in the xy-plane around pivot points, such that vehicle assembly 12 is capable of rotating to reach to any angle θ.

For ease of understanding, the various systems, subsystems, assemblies and subassemblies, which together make up MTS 10, will now be described.

The Rail System

Figure 3A:
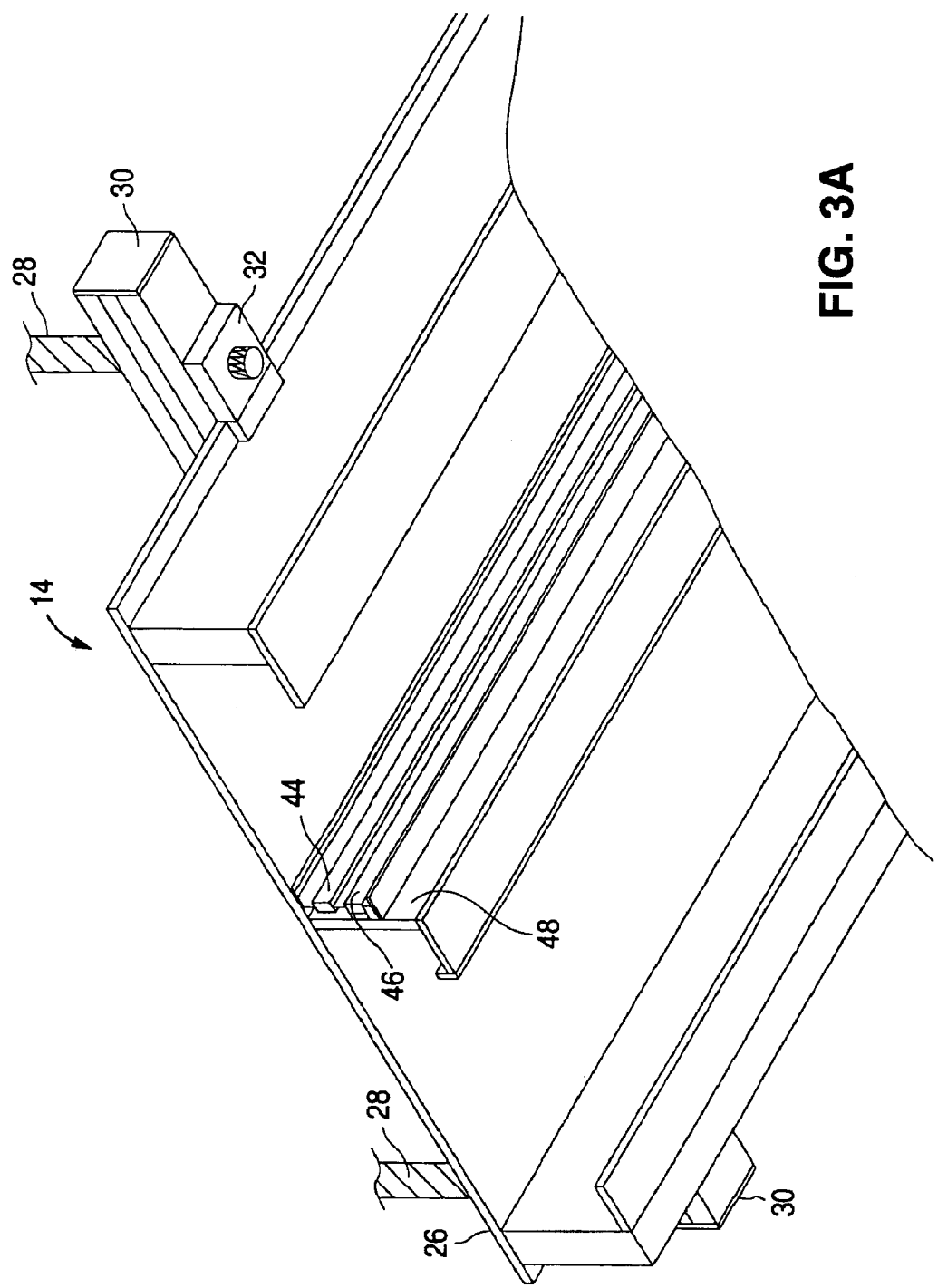
FIG. 3A is a perspective view of a portion of a rail system in accordance with the present invention.

FIG. 3A is a perspective view of a representative portion of rail system 14. Rail system 14 includes a series of modular track sections, such as track section 26. Track section 26 can be suspended from the structural roof of the manufacturing plant using structural support members 28 and a plurality of track hanging devices 30. Structural support members 28 may be a collection of beams, girders, rods, or other similar structural members capable of being mounted to the structural roof of the manufacturing plant. Preferably, structural supports 28 are threaded rods, typically disposed within a plenum space, (i.e., the space between the structural roof and the factory ceiling). A small portion of structural support members 28 is extended through the factory ceiling and coupled to track hanging device 30 using conventional coupling device, such as clamps, nuts and bolts, rivets, and the like. In one embodiment, the portion of structural support members 28 extending through the ceiling is a threaded rod. In this embodiment, rod 28 can be inserted through a mounting hole, defined on the hanging device 30, and secured thereto with a nut. In this manner, hanging device 30 is easily removable from structural support members 28.

Track hanging device 30 is mountable to track 26 using a conventional mounting device, such as a clamping device 32. Clamping device 32 can be disposed on opposite sides of each track section 26 to grasp track 26 on two sides for balance and rigidity. Each track section 26 can have any number of hanging devices 30 as necessary to safely and securely support rail system 14. Clamps 32 can be screw tightened to securely hold track 26 in position, and can be easily loosened to remove track 26. A typical track-hanging device 30 suitable for use with the present invention is commercially available from Item Products Inc. of Houston Tex.

In one embodiment, each structural member 28 is adjustable, such that each member can be extended through the factory ceiling to deploy track hanging devices 30 at varying heights above the factory floor. In a typical factory, the height of the factory ceiling above the factory floor may range from a minimum of about 2.4 m (about 8 ft.) to a maximum of about 3 m (about 10 ft.). In this embodiment, each track 26 of rail system 14 can be coupled to hanging device 30 and suspended, such that the clearance for MTS 10 above the factory floor is no less than that required to comply with accepted factory safety standards. In one embodiment, the clearance is no less than about 2.1 m (about 7 ft.). Adjustable support structure members 28 and track hanging device 30 simplify line expansion, mounting, and alignment of rail system 14. Moreover, by supporting rail system 14 from above the factory floor, MTS 10 provides an efficient use of factory space.

Figure 3B:
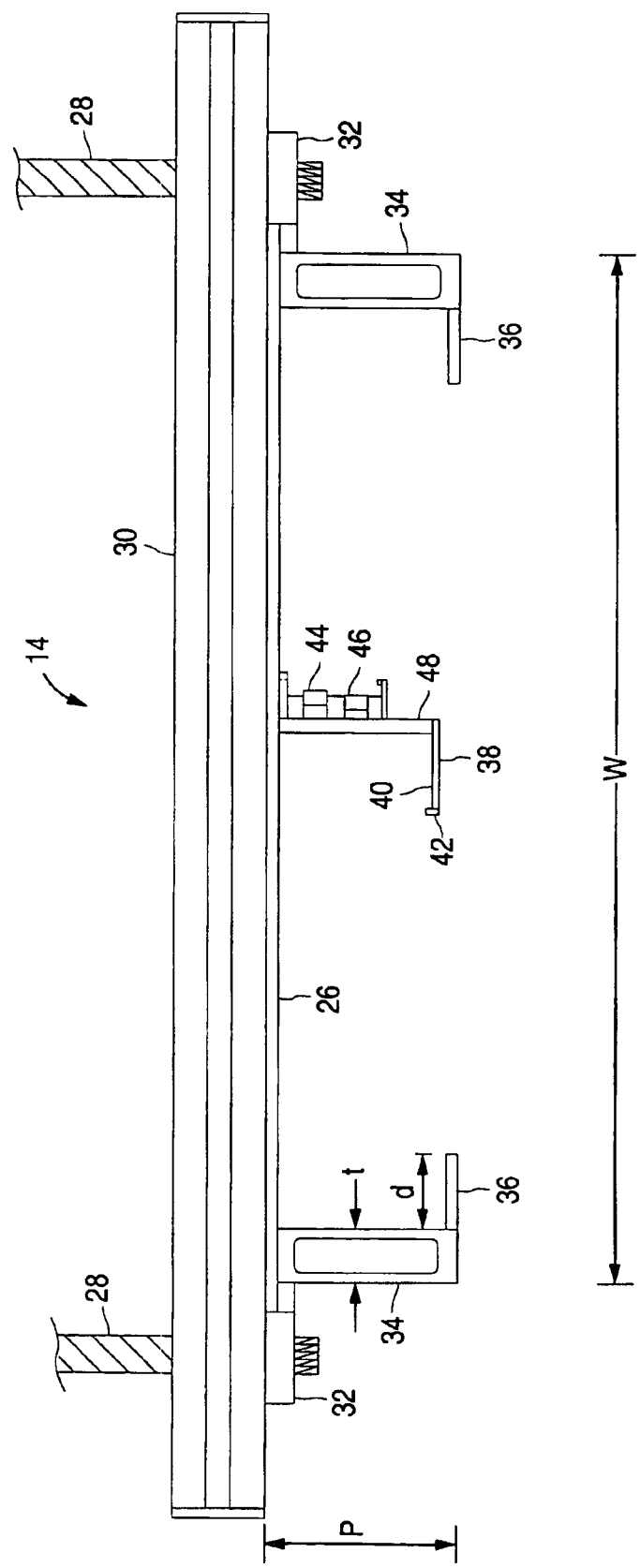
FIG. 3B is a cross-sectional view of the rail system of FIG. 3A.

FIG. 3B is a cross-sectional view of an embodiment of modular track section 26 in accordance with the present invention. In this embodiment, modular track section 26 is a "C" section extruded member with heavy sidewalls. The "C" shaped extruded track 26 includes an outside web portion 34, having a roller support section 36, and a central guide 38. In one embodiment, web portion 34 can have a rectangular cross section to provide optimal structural strength to support vehicle assembly 12. Although the dimensions of track 26 are not to be limited to any specific design, in one embodiment, the thickness t of web portion 34 may range from about 17 mm (about 0.7 in.) to about 40 mm (about 1.50 in.); more particularly, between about 25 mm (about 1 in.) and about 32 mm (about 1.25 in.). Roller support section 36 may extend out from web portion 34 a distance d, which is wide enough to support a vehicle roller (see FIG. 5B), for example, from between about 17 mm (about 0.70 in.) and about 33 mm (about 1.30 in.), more particularly between about 20 mm (about 0.80 in.) and about 28 mm (about 1.10 in.).

Central guide 38 is provided to guide vehicle assembly 12 and support the drive system (described below) of the present invention. An internal portion 40 of central guide 38 can contain the drive wheel of the drive system. Lip 42 is provided to provide a surface upon which spring-loaded rollers (see FIG. 5B) can impinge to steer the drive along central guide 38 during operation. As best understood with reference to both FIGS. 3A and 3B, electrically conductive strips 44 and 46, which may be made of copper are arranged on an external portion 48 of central guide 38. Copper strips 44 and 46 are disposed along the entire length of central guide 38 to provide an electrical connection to the drive system.

As shown in FIG. 3B, the "C" shaped extrusion, with web portion 34 allow for track section 26 to be made with a low profile P, which keeps vehicle assembly 12 close to the factory ceiling. In one embodiment, a distance of about 150 mm to about 155 mm (about 6 in.) is provided between the factory ceiling and rail system 14. Profile P may range from between about 50 mm (about 2 in.) and about 150 mm (about 6 in.); more particularly between about 63 mm (about 2.5 in.) and about 75 mm (about 3 in.). The "C" shaped extrusion has a width W that is substantially greater than its profile P. In this embodiment, width W may range from about 253 mm (about 10 in.) to about 508 mm (about 20 in.); preferably between about 305 mm (about 12 in.) to about 380 mm (about 15 in.). The wide extrusion relative to profile P helps to distribute y-axis loading of track 26. Each track section 26 may be made from any high strength, lightweight, structural material, such as aluminum, aluminum alloy, steel or composites.

Figure 3C:
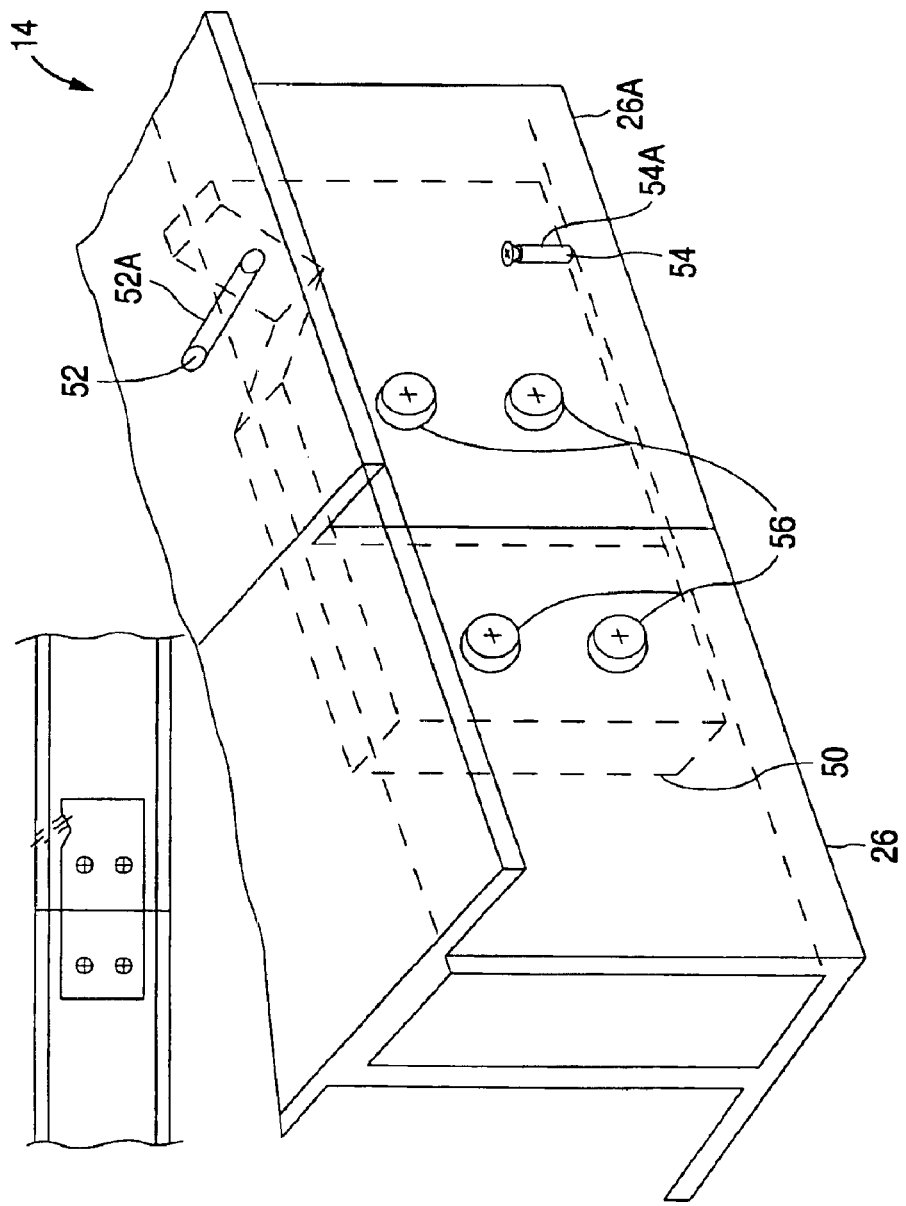
FIG. 3C is a simplified illustration of a perspective view of a rail coupling mechanism in accordance with the present invention.

FIG. 3C is a simplified illustration of an exemplary embodiment of inter-linking modular track sections 26 and 26A, which represent a portion of rail system 14. Each track section 26 and 26A can be coupled together at the ends using a coupling mechanism 50, which provides for substantially precise alignment. For example, coupling mechanism 50 may be a block shaped member mounted to bridge across the sides of two abutting track sections 26 and 26A to be connected using screws 56. In addition alignment pins 52 and 54 may be provided to facilitate fine alignment adjustments of adjacent track sections 26 and 26A. Coupling mechanism 50 and alignment pins 52 and 54 are arranged to enable track sections 26 and 26A to be releasably coupled to one another quickly and easily so that a serpentine track of any desired shape, with any number of branched sections can be assembled. Thus, track sections 26 can be formed into any desired shape, be it straight or curved. In the interest of modularity track section 26 may be formed in standardized lengths. For example, the length of the standardized sections may range up to about 2.4 m (about 8 ft.) in length. A curved track section (not shown) may be configured in 90° and 180° turns, with either about a 762 mm (about 30 in.) or about a 1143 mm (about 45 in.) radius of curvature. All curved sections may include straight lead in and lead out portions at each end.

As noted earlier the alignment of any two sections is maintained using alignment pins 52 and 54. In one embodiment, alignment pins 52 and 54 may be set screws, which are screwed into bores 52A and 54A. Prior to tightening screws 56, which fixedly secure track sections 26 and 26A together, set screws 52 and 54 are adjusted in or out to precisely align the track sections.

Vehicle Assembly
Car Carrier

Figure 4A:
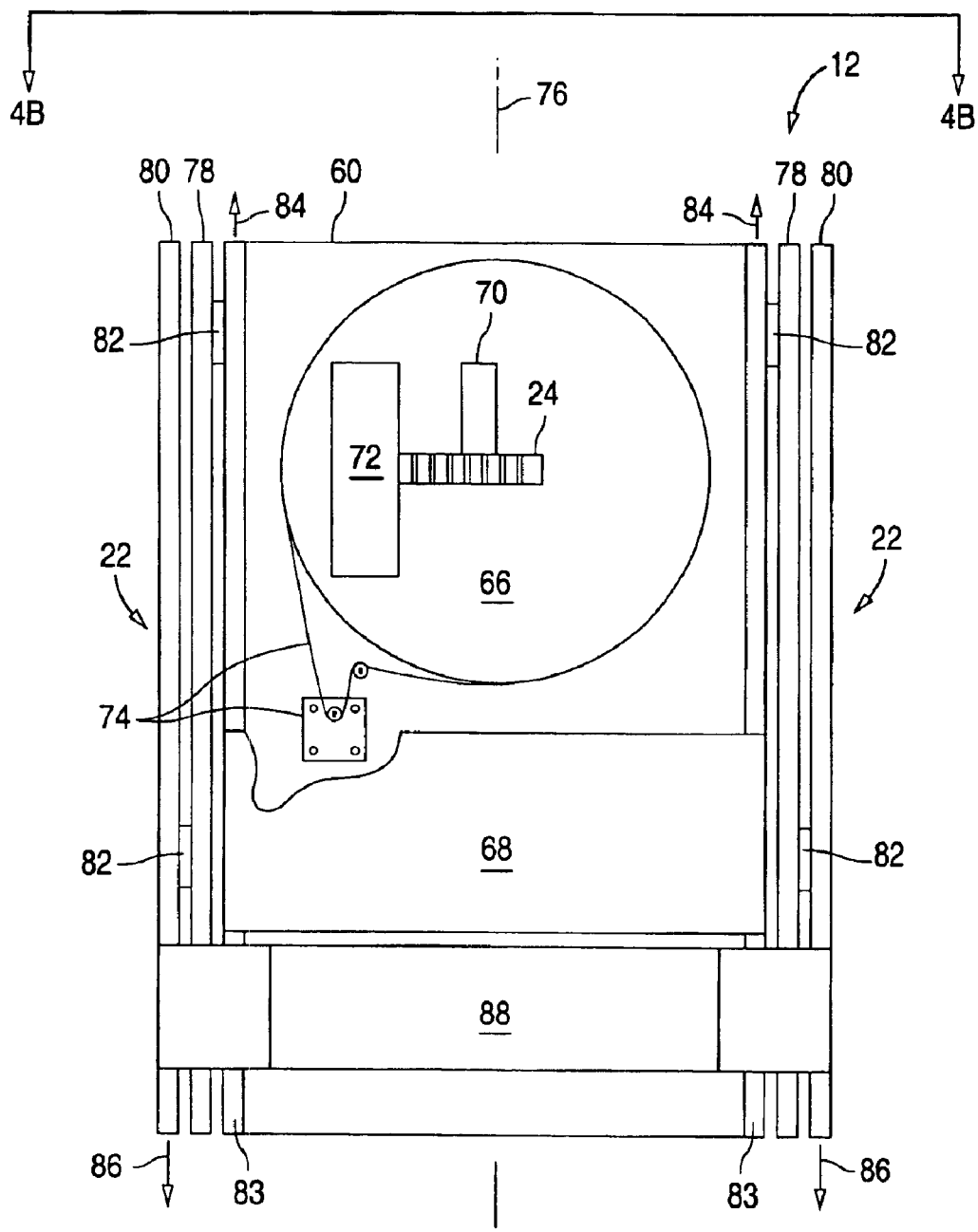
FIG. 4A is a simplified illustration of a view from a factory floor of an embodiment of the vehicle assembly of the present invention.

FIG. 4A is a simplified illustration of an embodiment of vehicle assembly 12 as viewed up from the factory floor. Vehicle assembly 12 includes a car carrier 60, which is transitionally coupled to and moves along rail system 14 under the power of drive system 90 (see FIGS. 5A and 5B). Car carrier 60 may be a planar member having adequate surface area on which to mount the remaining components of vehicle assembly 12, such as extendible member assembly 22, car platform 66, hoist assembly 24, storage unit 68, component housing 88 and vehicle controller (VC) 70. For this purpose, car carrier 60 may have any geometry and dimensions. For example, car carrier 60 may be a rectangular member having a thickness of between about 8 mm (about 0.30 in.) and about 25 mm (about 1 in.); a width of between about 254 mm (about 10 in.) and about 508 mm (about 20 in.); and a length of between about 457 mm (about 18 in.) and about 914 mm (about 36 in.) Any high strength to weight structural materials can be used for car carrier 60, such as aluminum, aluminum alloy titanium, steel, or high strength composites.

Car carrier 60 is configured to extend (or decrease) in length in the xy-plane, such that, in operation, hoist assembly 24 moves out relative to the center of car carrier 60 (See FIG. 4C, discussed below). In one embodiment, extendible member assembly 22 is provided to cause the length of car carrier 60 to increase (or decrease) in length, which effectively moves hoist assembly 24 away from the center of car carrier 60.

As shown in FIG. 4A, extendible member assembly 22 is broadly symmetrical about car carrier centerline 76. Thus, the description of extendible member assembly 22 is directed to only one side of the assembly, with reference to the other side, only when necessary to describe a feature of the invention, since it is understood that the other-side is structurally and functionally the same.

In one embodiment, extendible member assembly 22 includes an internal extending member 78 and an external extending member 80 members 78 and 80 are each capable of being moved relative to each other and car carrier 60. Each extendible member 78 and 80 can be made of a lightweight, high strength material, such as a composite, aluminum, aluminum alloy or titanium. The form of each extendible member 78 and 80 can be any appropriate geometric shape, which can provide the requisite strength, such as a bar having a circular or rectangular cross-section. In one embodiment, each extendible member 78 and 80 includes an area upon which a slider mechanism 82 can be operably mounted. Again referring to FIG. 4A, a plurality of slider mechanisms 82 are mounted between a side 83 of car carrier 60 and internal extending member 78 and between internal extending member 78 and external extending member 80. Slider mechanisms 82 can be any conventional linear motion system which provides a compact, low friction, low profile mechanism with a high moment and heavy load bearing capacity, requiring little or no maintenance. A variety of linear motion systems suitable for use in the present invention are commercially available from THK Ltd. of Tokyo, Japan.

In one embodiment, to cause car carrier 60 and extending members 78 and 80 to move, a conventional motor drives a lead screw (not shown), which is also moveably coupled to extending member 80 and car carrier 60. When operated, the lead screw forces member 80 to move rearward in the direction of arrow 86 and car carrier 60 forward in the direction of arrow 84. Extending member 78 remains stationary relative to the moving parts. In this embodiment, components housed in component housing 88 move: rearward with the movement of extending member 80. In this manner, housing 88 provides counterbalancing weight as car carrier 60 extends. In alternative embodiments, ballast can be added to housing &8, if necessary, to improve the balance.

Figure 4B:
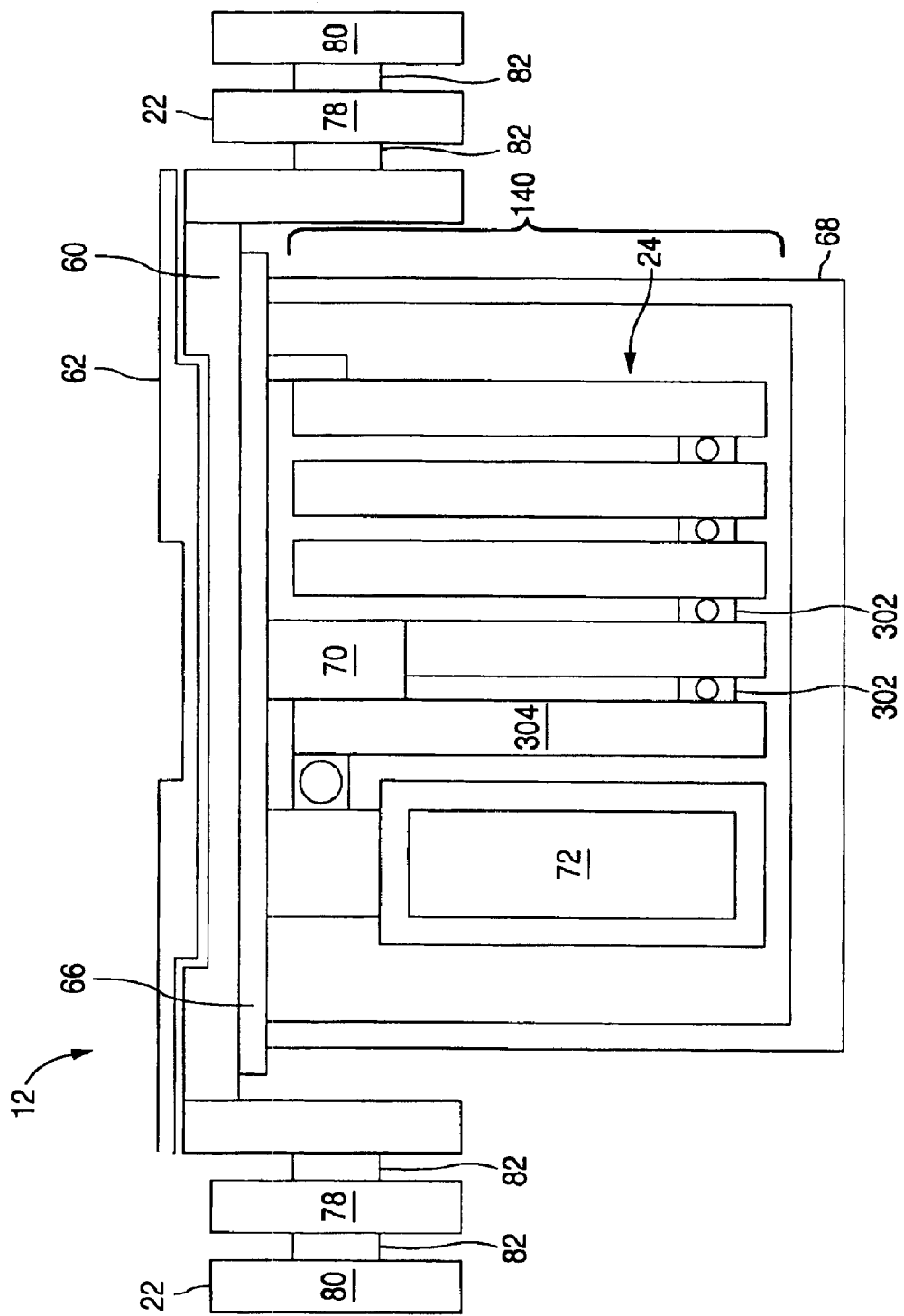
FIG. 4B is a simplified illustration of a cross-sectional view of the embodiment of FIG. 4A.
Figure 4C:
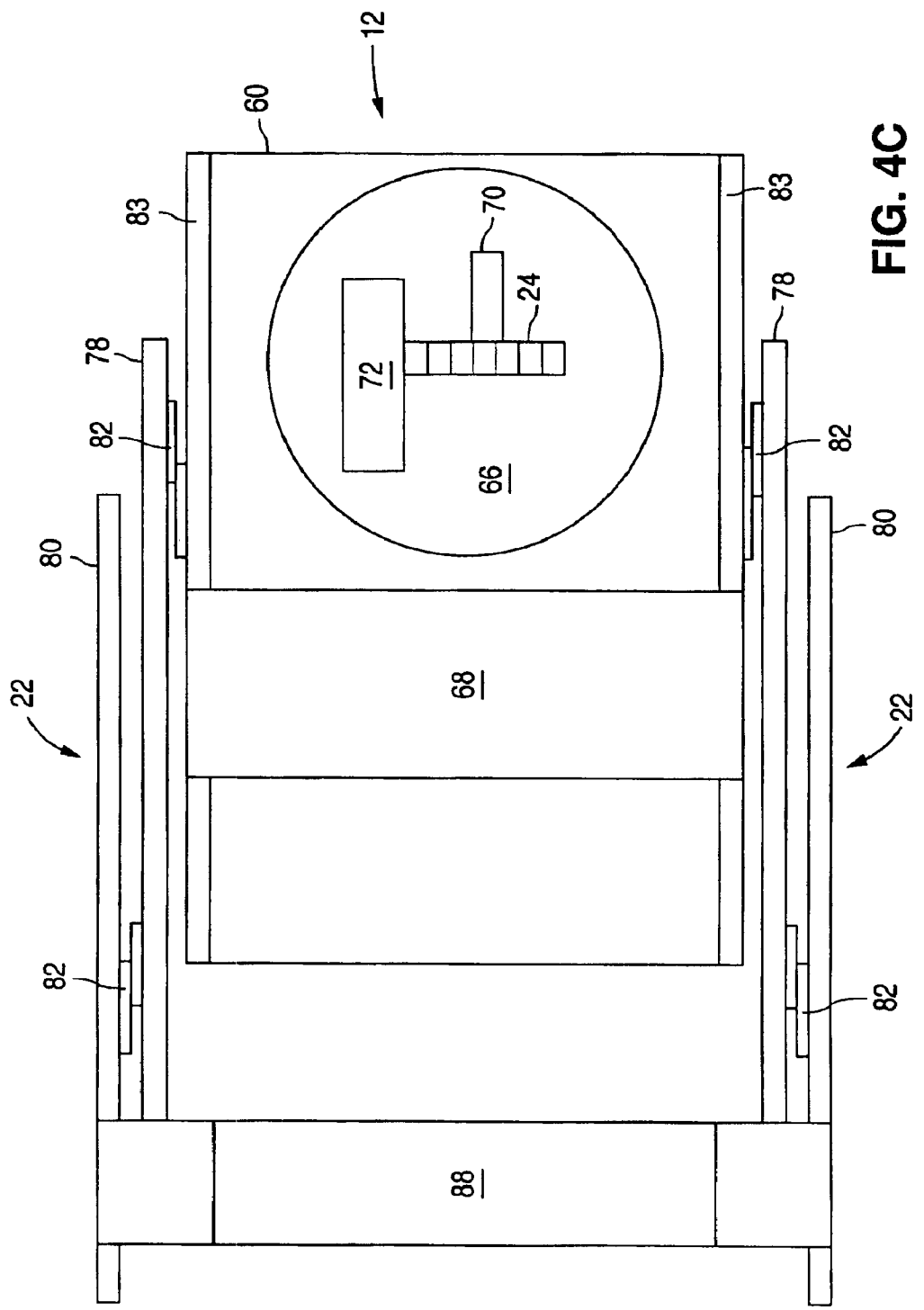
FIG. 4C is a simplified illustration of an extended embodiment of FIG. 4A.

A simplified illustration of car carrier 60 in an extended configuration is shown in FIG. 4C. In one embodiment, car carrier 60 can extend to any location in the xy-plane no less than about 1.1 m (about 45 in.) from car carrier center line 76. Car carrier 60 can also rotate in the xy-plane +/−90° to allow placement of magazine 72 on the processing tool.

Referring again to FIG. 4A, car platform 66 is a round, plate-like, member, rotatable to permit hoist assembly 24 to rotate, such that hoist assembly 24 and its payload, magazine 72 can be aligned with a target location as desired. Car platform 66 can be rotated using a conventional drive system 74, such as a belt or chain drive system coupled to a motor. In one embodiment, car platform 66 can be rotated to +/−180° to allow placement of magazine 72 in any orientation on the processing tool.

Figure 5B:
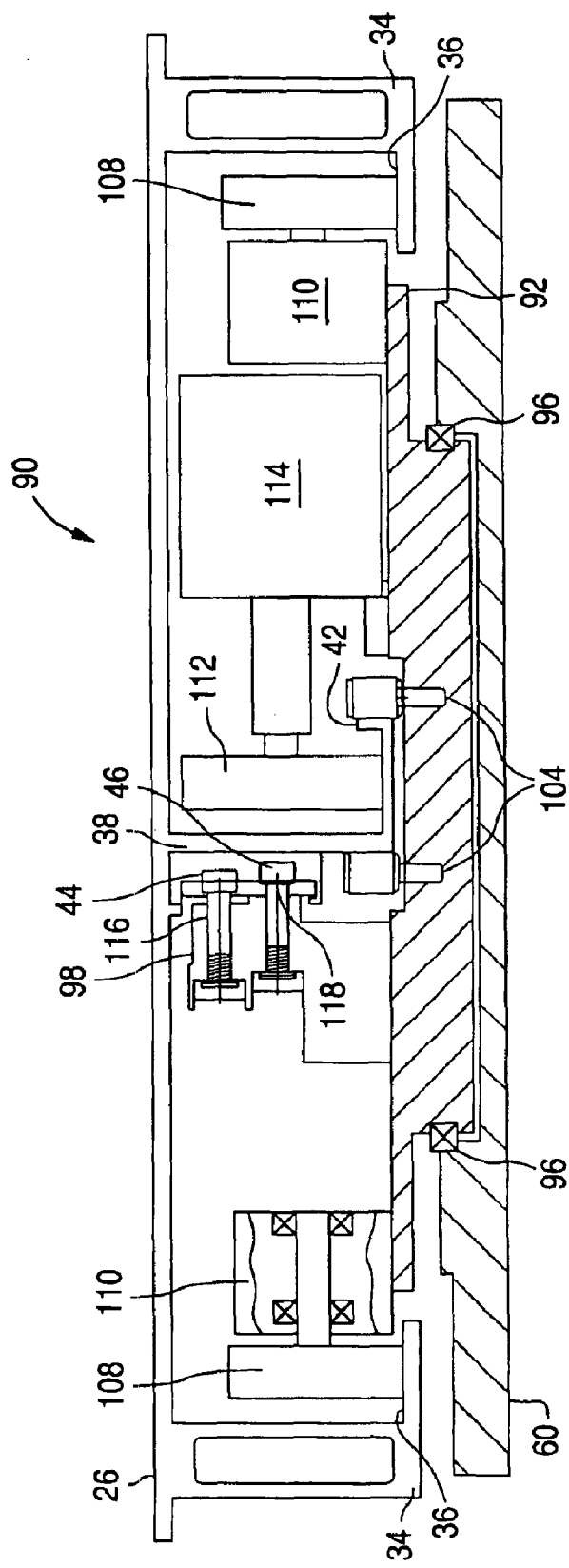

Drive System FIGS. 5A and 5B are simplified illustrations of an embodiment of a drive system 90 in accordance with the present invention. FIG. 5A shows car carrier 60 and axles 92a and 92b as viewed from above through modular track section 26 (partially shown in phantom). In this embodiment, axles 92a and 92b couple car carrier 60 to drive system 90 (see also FIG. 5B). Axles 92a and 92b include bearings 96 (FIG. 5B), which allow axles 92a and 92b to swivel about pivot points 94a and 94b relative to car carrier 60 up to about +/−20°. In this manner, car carrier 60 can translate, especially on the curved portions of modular track sections 26 without generating significant friction, which may otherwise cause drive system 90 to bind. In one embodiment axles 92a and 92b are flat sheets of low weight, high strength material, such as titanium aluminum or aluminum alloy.

Axles 92a and 92b provide support for the components of drive system 90, which includes power pick-up assembly 98, truck assemblies 100, driver 102, and spring loaded rollers 104. As shown in FIG. 5A, drive system 90 is broadly symmetrical about car carrier centerline 105 and about axis 106. Thus, the description of drive system 90 is directed to only one end or one side of the drive system, with reference to the other end or other side, only when necessary to describe a feature of the invention, since it is understood that the other side is structurally and functionally the same.

Truck assemblies 100 are located at each side of axles 92a and 92b. Truck assemblies 100 are provided to carry the load of material transport system 10 as the system is made to translate over track sections 26. In one exemplary embodiment, truck assemblies 100 each include a load support wheel or roller 108 arranged to roll within roller support section 36 of track 26. Load support wheels 108 are coupled through a pillow block 110 to axles 92a and 92b. Pillow block 110 provides a bearing surface for supporting the rotation of load support wheels 108, while load support wheels 108 are configured to distribute net loads and reduce wear on track 26. In one embodiment, each of the four load support wheels 108 may be spring loaded or combined with a type of shock absorber, such that load support wheels 108 can smoothly step over track joints and/or other anomalies, which may otherwise cause jostling or other undesired motion of car carrier 60.

Drive system 90 also provides a steering function for car carrier 60. To this end, drive system 90 includes eight spring-loaded rollers 104 (four on each axle 92a and 92b). As shown in FIG. 5B, each spring-loaded roller 104 is configured to engage a respective portion of central guide portion 38. For example, two rollers engage a backside 41 of central guide 38 while the two other rollers engage lip 42. Spring loaded rollers 104 steer car carrier 60 along central guide 38. In one embodiment, spring loaded rollers 104 can provide support to car carrier 60 through sharp turns in track 26, even with an unbalanced load on car platform 66 (not shown). In this embodiment, with no intent to limit the invention, spring loaded rollers 104 may be spaced axially at least about 127 mm (at least about 5 in.) apart and spaced laterally at least about 50 mm (at least about 2 in.) apart to minimize friction and reduce the possibility of binding.

Drive system 90 further provides the locomotive force needed to move car carrier 60 around rail system 14 through a driver 102. In one embodiment, driver 102 includes a drive wheel 112 and a motor 114. Driver 102 is mounted on axle 92a, such that it operatively contacts central guide 38. In this embodiment, drive wheel 112 is positioned within internal portion 40 (FIG. 3B) of central guide 38. It should be understood that the locomotive force needed to cause car carrier 60 to translate over rail system 14 can be provided by many conventional drive power configurations. In most embodiments, the drive power should be capable of translating the entire car carrier 60 including up to five magazines 72, which can equal between about 4.5 kg (about 10 lbs.) and about 22.5 kg (about 50 lbs.) at a velocity of up to about 1.8 m/s (about 6 ft/sec.). Thus, a typical motor 114 should be capable of delivering between about 0.15 Hp and about 0.5 Hp; and more particularly 0.2 Hp. In one embodiment, motor 114 is a worm drive stepper motor, which provides controllable acceleration/deceleration profiles and eliminates the need for a breaking system. In this embodiment, drive wheel 112 is mounted on an output shaft of motor 114, such that the output from motor 114 causes drive wheel 114 to rotate, and thereby engage track 26 to cause car carrier 60 to translate on track 26. The worm drive stepper motor 114 has the advantage of a reduced power requirement and a power failure safety feature. Alternatively, motor 114 is coupled to drive wheel 112 using a conventional belt or chain drive system to deliver the locomotive power.

As also shown in FIGS. 5A and 5B, drive system 90 may include a power pick-up assembly 98. Power pick-up assembly 98 is a well-known device for providing power to a translating vehicle. In one embodiment, power pick-up assembly 98 includes sliding contacts 116 and 118, typically a pair of brushes. Brushes 116 and 118 are configured to slidingly engage copper strips as car carrier 60 translates along track 26, such that electrical power is transferred from copper strips 44 and 46 to drive system 90. Power pick-up assembly 98 can be used to supply any required power; for example, 24 vdc maximum.

Storage Unit

Figure 6A:
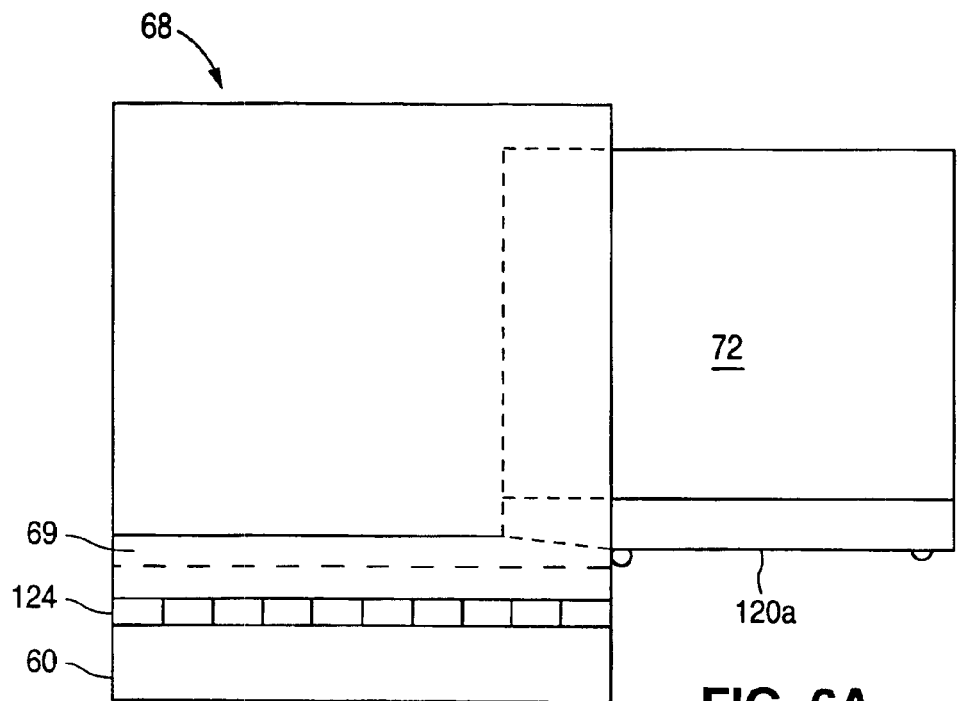
FIG. 6A is a simplified illustration of a side view of an embodiment of a storage unit of the present invention.
Figure 6B:
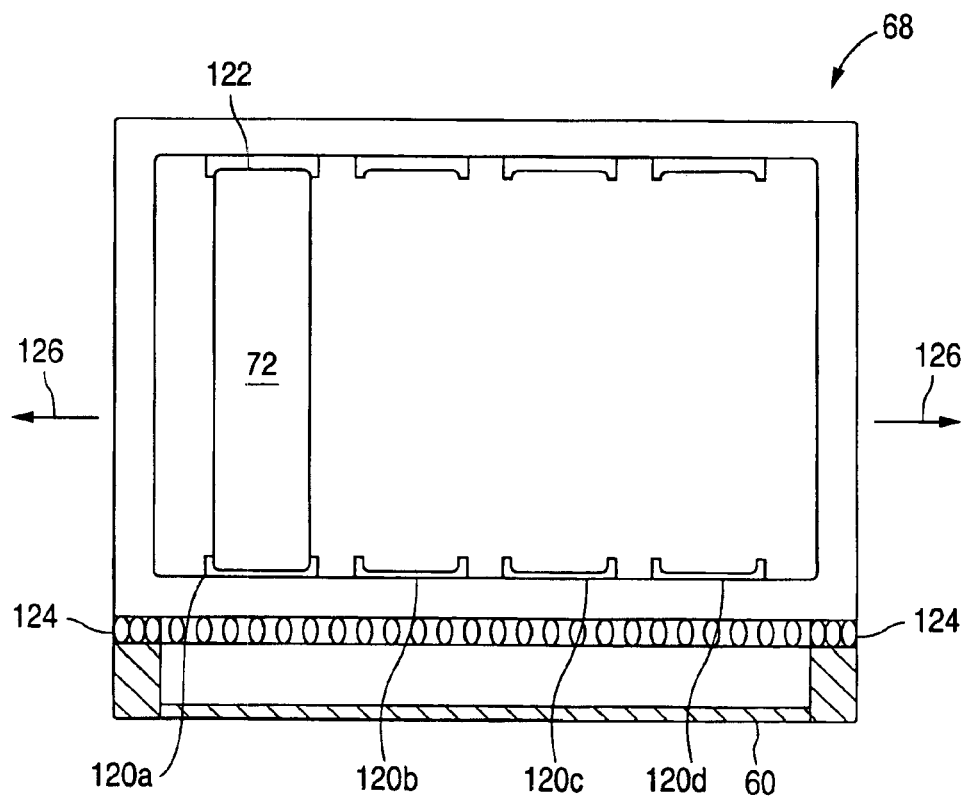
FIG. 6B is a simplified illustration of a front view of the embodiment of FIG. 6A.

FIGS. 6A and 6B are simplified illustrations of a side and front view, respectively, of storage unit 68 in accordance with the present invention. In one embodiment, as shown in FIGS. 2 and 4A, storage unit 68 can be mounted to car carrier 60 and used to store a plurality of materials or payloads 72 (e.g., magazines) during transportation between processing tools. The ability to transport a plurality of magazines 72 per transport cycle is advantageous in that it increases the efficiency of MTS 10. Storage unit 68 can be configured to store any number of magazines, depending primarily on the size of the magazines. In one embodiment, storage unit 68 is about 457 mm (about 18 in.) wide, about 356 mm (about 14 in.) in length, and about 203 mm (about 8 in.) in height. In this embodiment, storage unit 68 may be designed to carry up to 4 magazines 72 having a total payload weight of about 18 kg (about 40 lbs.). Storage unit 68 may be made of any lightweight, high strength structural material, such as aluminum.

Referring again to FIGS. 6A and 6B, storage unit 68 includes a drawer 120a, which can be made to slide in and/or out from storage unit 68 using a well known actuator 69. In operation, when it is desired to store magazine 72 in storage unit 68, drawer 120a is extended. Hoist assembly 24 then places magazine 72 on drawer 120a. Drawer 120a is then retracted back into the storage unit. Optionally, as shown in FIG. 6B, a slot 122 may be provided on a top portion of storage unit 68 to hold and further secure magazine 72 in position and prevent wobbling and the like.

In one embodiment, as best understood from FIGS. 6A and 6B, storage unit 68 can be coupled to car carrier 60 via a sliding actuator 124. Sliding actuator 124 permits storage unit 68 to translate side-to-side in the direction indicated by arrows 126. In this manner, once one drawer 120a has been occupied, storage unit 68 can be moved over to permit an additional magazine 72 to be loaded on a second drawer 120b. The process can be repeated until all drawers 120a–120d are filled. The process may be reversed to remove magazines 72 from drawers 120a–120d. Advantageously, if desired, magazines 72 can be offloaded in a different sequence from which they were loaded by moving storage unit 68 back-and-forth accordingly. Sliding actuator 124 can be any conventional sliding actuator that provides accurate powered linear motion. In this embodiment, sliding actuator 124 incorporates a driving mechanism, such as a belt or screw drive and a linear motion mechanism into a single unit. Sliding actuator 124 is driven by a conventional motor, such as a stepper motor or servomotor. Examples of a typical actuator 69 or sliding actuator 124 suitable for use with the present invention are available from THK Ltd. of Tokyo, Japan.

Hoist Assembly

FIG. 4B includes a simplified illustration of hoist assembly 24. Hoist assembly 24 is a 3-axis assembly, which includes an extendible member 140 (see FIG. 7A) and a spooling mechanism 142 (see FIG. 8A). As described below, gripper assembly 200 (see FIG. 9) can be disposed at a distal end of extendible member 140, and used to grip magazines 72 for transport.

Extendible member 140 of hoist assembly 24 can be any extendible member capable of extending out while providing substantial rigidity to precisely position magazine 72 into a target location. In one embodiment, extendible member 140 includes a plurality of telescoping linear slide assemblies, coupled together in a sliding arrangement to provide a rigid positional platform. It can be appreciated that any number of linear slide assemblies of variable lengths can be used so long as hoist assembly 24 can perform its intended function. In this embodiment, up to eight slide assemblies can be used, each having an equal length of between about 203 mm (about 8 in.) and about 381 mm (about 15 in.); for example, a length of about 254 mm (about 10 in.) may be used. This allows extendible member 140 to reach down from a height of about 1778 mm (about 70 in.) to about 152 mm (about 6 in.) above the factory floor; for example, between about 1524 mm (about 60 in.) and about 406 mm (about 16 in.).

Figure 7A:
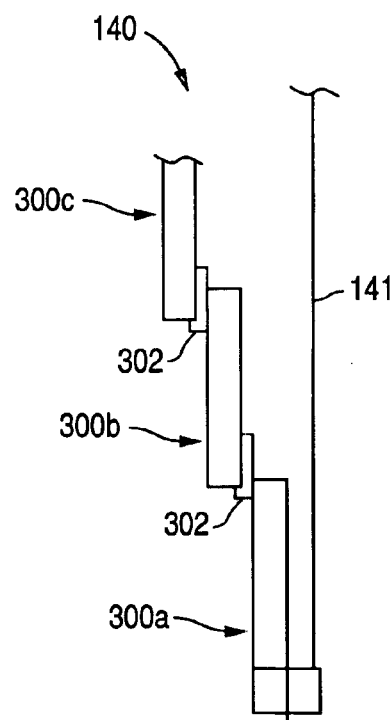
FIGS. 7A and 7B are simplified illustrations of side and front views, respectively, of an embodiment of the hoist assembly of the present invention.
Figure 7B:
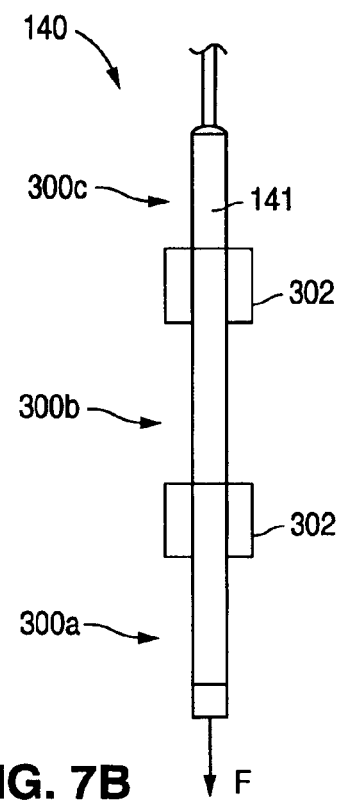

Generally, FIGS. 7A and 7B show the top and side views, respectively, of representative portions of an embodiment of extendible member 140. As shown, each slide assembly 300a–300c engages a preceding or following sliding assembly (e.g., sliding assemblies 300a and 300c), with the exception of the slide assemblies at the extreme ends of extendible member 140. In this embodiment, the linear slide assemblies are coupled together using a slider mechanism 302. Slider mechanism 302 permits each sliding assembly to move relative to each other sliding assembly to move relative to each other sliding assembly. Slider mechanism 302 is a conventional linear motion slider and is commercially available, for example, from THK Ltd. of Tokyo, Japan.

Figure 7C:
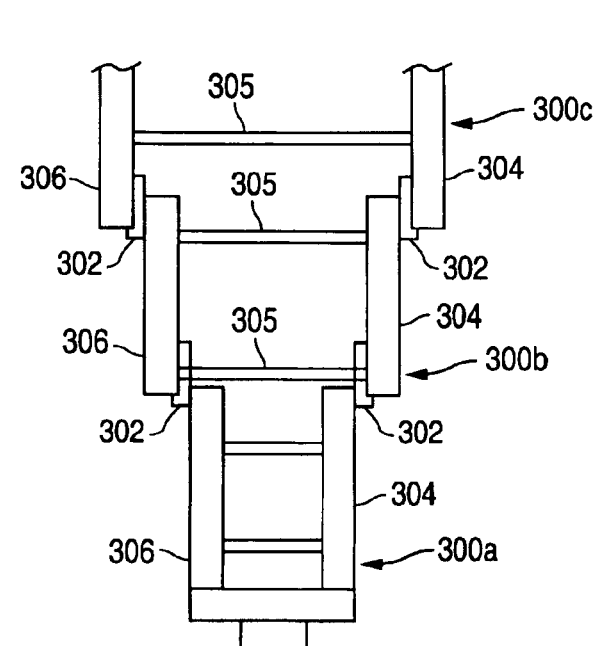
FIG. 7C is a simplified illustration of a front view of an alternative embodiment of the hoist assembly of the present invention.

As shown in FIG. 7C, additional torsional stiffness can be obtained with little increase in weight by adding another set of sliding members. In this embodiment, each slide assembly 300a–300c includes a first structural member 304 and second structural member 306 coupled together, in parallel, using cross braces 305. As is apparent from FIG. 7C, having two structural members 304 and 306 provides lateral stability and rigidity to extendible member 140. The torsional resistance of the system is increased with the addition of cross braces 305. For example, a load F causes tensile stresses in side members 304 and 306. However, cross braces 305 cancel shear stresses that would otherwise tend to cause extendible member 140 to twist. Accordingly, the tendency for a payload to sway from side-to-side or twist as it is raised or lowered is reduced or removed.

Figure 8A:
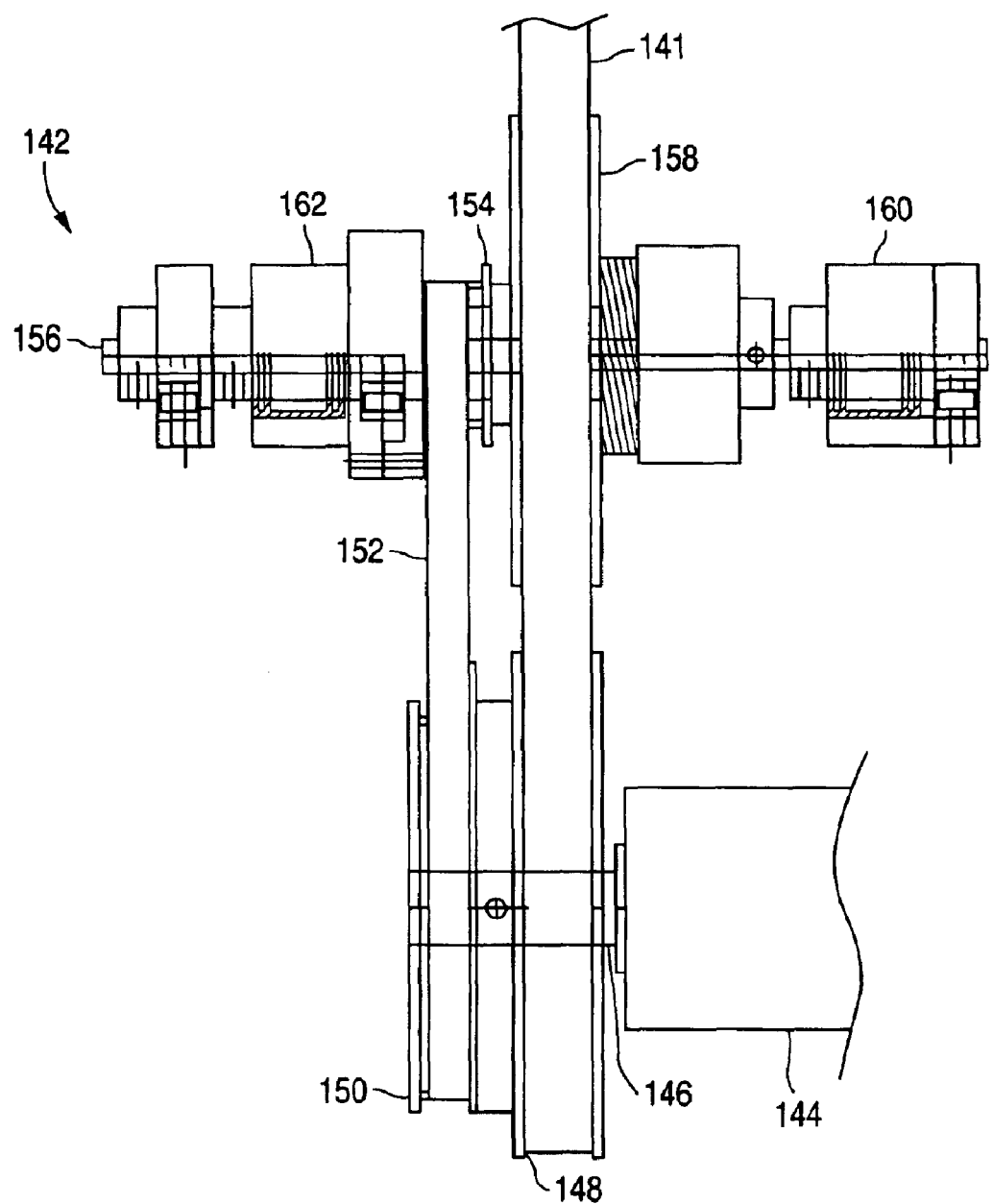
FIG. 8A is a simplified illustration of a top view of a spooling mechanism in accordance with the present invention.

To raise or lower extendible member 140, a hoisting line or belt 141. (FIG. 7A) is coupled to the leading slide assembly 300a. In one embodiment, hoisting belt 141 is wound or unwound from spooling mechanism 142. As shown in the embodiment of FIG. 8A, spooling mechanism 142 may be driven by a drive motor 144 attached to a drive shaft 146. Coupled to drive shaft 146 are winding pulley 148 and drive pulley 150. Drive pulley 150 is operably coupled via belt 152 to a corresponding drive pulley 154 mounted to spindle 156. Winding pulley 152 provides a winding path for belt 141 to spool 158.

Figure 8B:
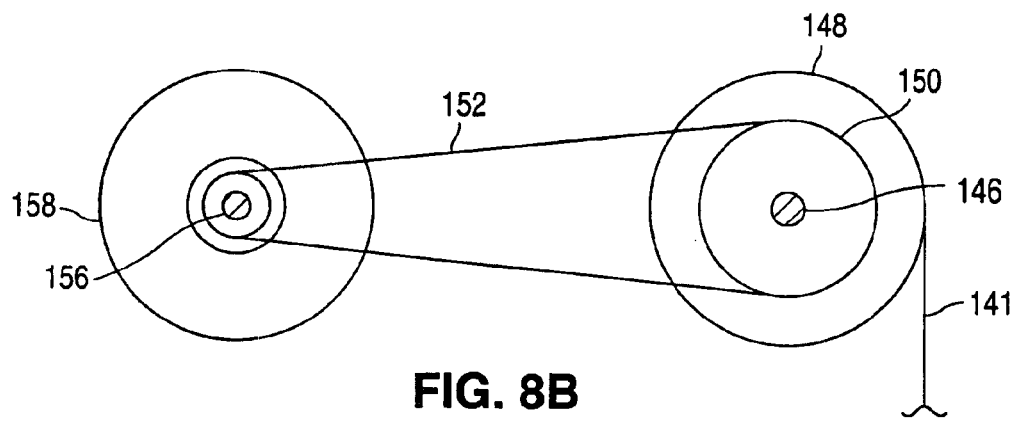
FIG. 8B is a simplified illustration of a side view of FIG. 8A.

During operation, belt 141 remains in constant tension to avoid slacking. As best understood from FIGS. 8A and 8B, two separate one way clutches 160 and 162 and friction type slip clutch 161 may be used to control constant tension on belt 141. For example, as belt 141 is collected or wound around spool 158, the effective diameter of spool 158 begins to vary caused by the buildup of belt 141.

During a raising operation, pulley 154 turns faster than required to maintain tension on belt 141. One-way clutch 162 couples rotation to spindle 156 which turns slip clutch 161 and spool 158. When belt 141 comes into tension, slip clutch 161 maintains tension by slipping at it's set load.

During a lowering operation, pulley 154 is decoupled to spindle 156 by one-way clutch 162. Clutch 160 locks spindle 156 to prevent it from rotating. Friction slip clutch 161 slips at its set load thus keeping constant tension on belt 141.

Although spooling mechanism 142 has been described in detail above, it should be appreciated that other mechanisms for lifting and lowering belt 141 can be used.

Gripper Assembly

Figure 9:
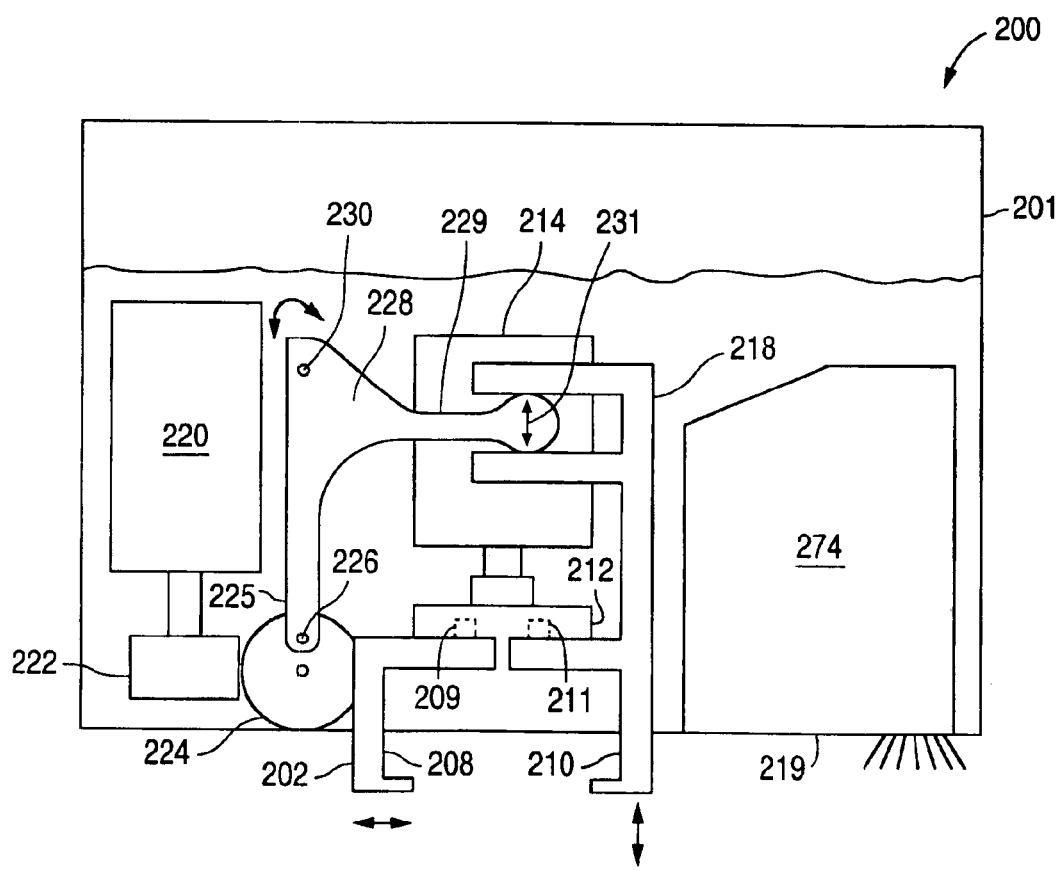
FIG. 9 is a simplified illustration of an embodiment of a gripper assembly in accordance with the present invention.

FIG. 9 is a simplified illustration of a cut-away view of a bottom portion of gripper assembly 200 in accordance with the present invention. As previously mentioned, gripper assembly 200 is operably coupled to an end of extendible member 140. Gripper assembly 200 includes any suitable grasping mechanism 202 disposed on its lower face 219 for grasping the payload.

Although, hoist assembly 24 (FIG. 4B) of the present invention is operable with any form of payload, in this embodiment, gripper assembly 200 and gripper mechanism 202 are designed to grasp magazine 72 (FIGS. 1, 4A, 6A, 6B, 7A, 7B, 10). Magazine 72 can be any conventional semiconductor chip carrier, which is configured for chute loading of the processing tool.

Figure 10:
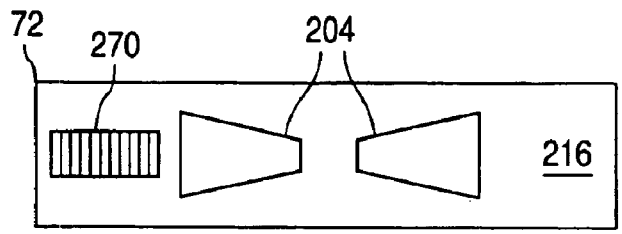
FIG. 10 is a simplified illustration of a top view of a payload magazine in accordance with the present invention.

FIG. 10 shows a top plan view of an embodiment of magazine 72. Magazine 72 is designed with openings 204 formed on a top face 216. In this embodiment, each opening 204 is shaped like a truncated triangle to provide a centering feature for grasping mechanism 202, such that small errors in the placement of grasping mechanism 202 can be tolerated.

The components of gripper assembly 200 will now be described with regard to their intended functions, which include the grasping function and the payload identification function.

Figure 11:
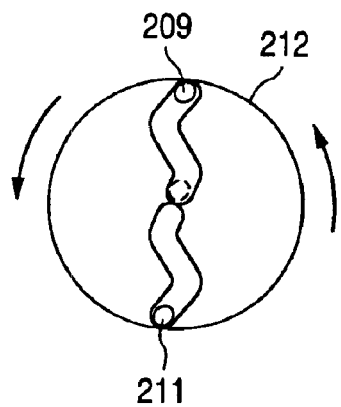
FIG. 11 is a simplified illustration of a top view of a cam used in an embodiment of the gripper assembly of the present invention.

Referring now to FIG. 9, in one embodiment, grasping mechanism 202 includes fingers, 208 and 210, which have followers 209 and 211, formed thereon. In performance of the grasping function, to hold magazine 72, fingers 208 and 210 are inserted into openings 204 (FIG. 10). The internal mechanisms of gripper assembly 200, described below, cause fingers 208 and 210 to move in toward the center of gripper housing 201. To release magazine 72, fingers 208 and 210 are made to move out away from the center of gripper housing 201. In this embodiment, the action performed by grasping mechanism 202 are caused using a cam 212 and followers 209 and 211 (see FIG. 11). In operation, as cam 212 is made to rotate using, for example, motor 214, followers 209 and 211 are forced in toward the center of cam 212, which causes fingers 208 and 210 to move inward. To open fingers 208 and 210, cam 212 is rotated again, such that followers 209 and 211 are forced outward toward a periphery of cam 212.

A structure 218, supports grasping mechanism 202, and can float i.e., (not fixed) within gripper housing 201, such that structure 218 is free to move up and down relative to magazine 72. Once magazine 72 has been grasped, magazine 72 can be lifted up, such that top face 216 of magazine 72 contacts bottom face 219 of gripper housing 201. In one embodiment, the up and down movement of structure 218 is created using motor 220, which rotates a pulley or gear 222, causing a cam 224 to rotate actuator arm 225. As cam 224 rotates, follower 226 of rocker arm 228 rotates about point 230, causing arm 229 to move structure 218 up or down in the direction indicated by arrow 231. Once in the up position, structure 218 remains in position to ensure that magazine 72 is held snugly against housing 201 and does not dangle or wobble. In this way, structure 218 prevents extraneous movement of magazine 72 during transport.

To release magazine 72, structure 218 is moved down by counter-rotating rocker arm 228 using motor 214. Once magazine 72 is in position, fingers 208 and 210 are made to move outward and release magazine 72.

Automatic Shut-Off and Release

Figure 12A:
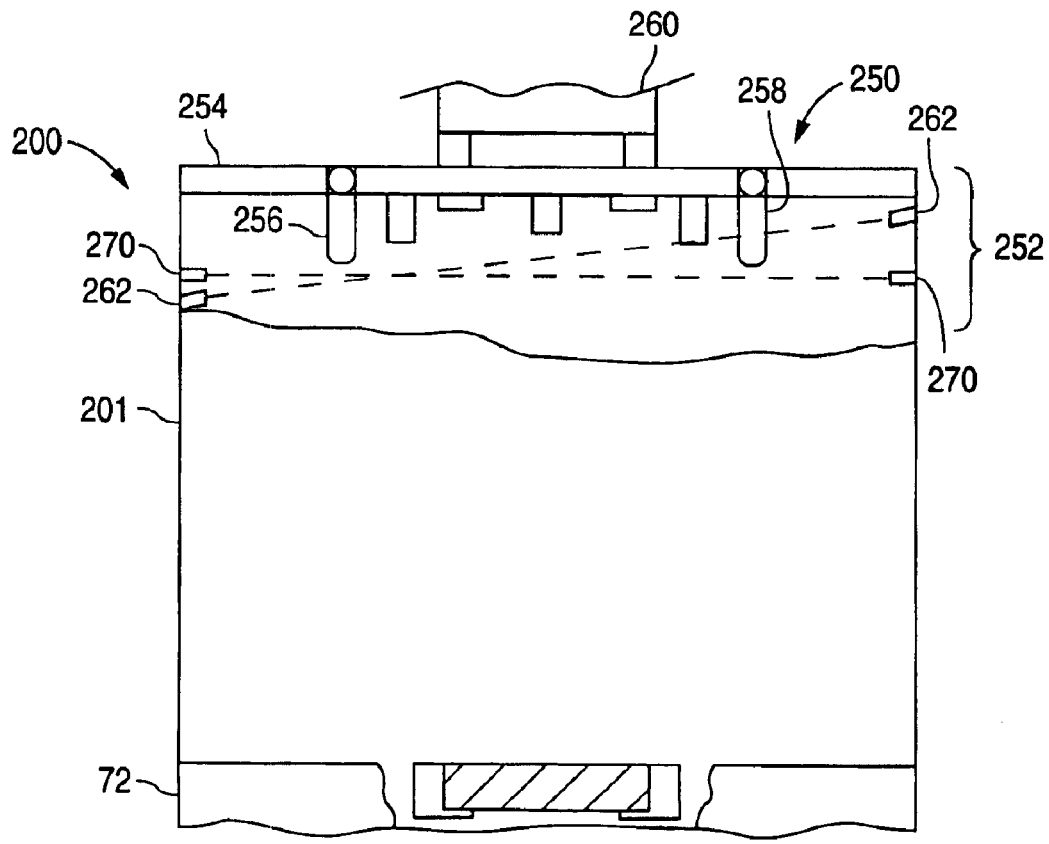
FIGS. 12A–12C are simplified illustrations of front views with a cut-away portion of an embodiment of the gripper assembly in accordance with the present invention.

As shown in FIG. 12A, gripper assembly 200 may include automatic shut-off system 250. In a first operational mode, automatic shut-off system 250 can provide a contact indication. The indication causes hoist assembly 24 to cease operation when, for example, magazine 72 has contacted an obstruction or is to be placed on an uneven surface. In a second mode of operation, automatic shut-off system 250 can stop hoist assembly 24 and cause gripper assembly 200 to automatically release magazine 72 at a target location, for example, in the chute of a processing tool.

FIG. 12A shows an embodiment of the first operational mode of automatic shut-off system 250. In this embodiment, a lid or cover 254 of housing 201 can be used as the trigger mechanism for initiating shut-off system 250. Cover 254 can be designed to freely float or move within slots 256 and 258. Lid 254 is coupled to hoist assembly 24 using coupling device 260.

Figure 12B:
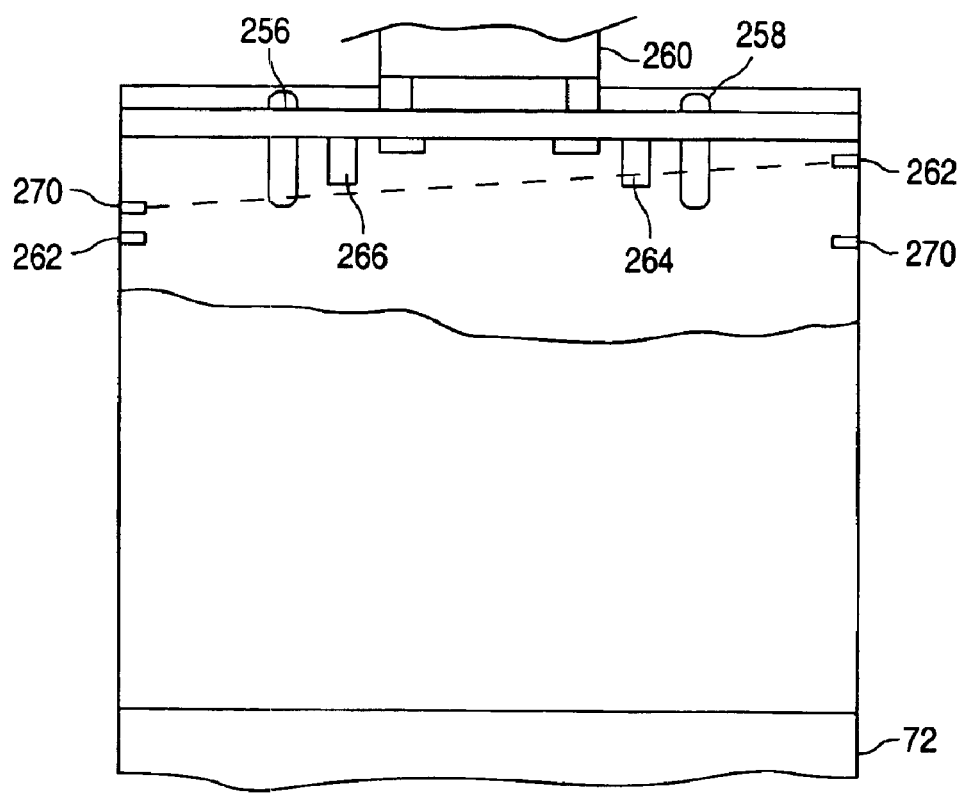

Automatic shut-off system 250 includes a first set of optical sensors 262. During transportation of magazine 72, the magazine may encounter an obstruction, such as an operator's hand. As magazine 72 contacts the obstruction, the progress of gripper assembly 200 is impeded. However, since cover 254 is free to move within slots 256 and 258, the progress of hoist assembly 24 causes cover 254 to continue to move (see FIG. 12B). As shown in FIG. 12B, small projections 264 and 266 are formed on cover 254 such that, as cover 254 continues forward, projections 264 and 266 break the optical beam (indicated by dash lines) of first optical sensor 262. Once the optical beam is broken, MTS 10 ceases operation.

Figure 12C:
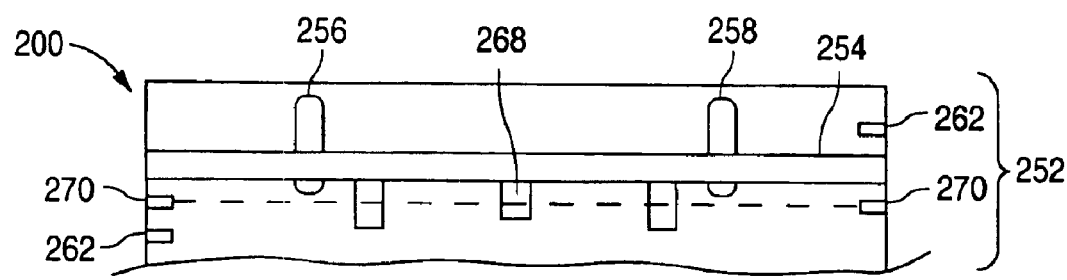

In the second mode of operation, automatic shutoff system 250 operates in substantially the same manner as in the first operational mode, with the one exception now described. As MTS 10 enters into the payload delivery portion of its programming, the first set of optical sensors 262 are shut off. As best understood from FIG. 12C, a second set of optical sensors 270, positioned within gripper housing 201, are turned on. Thus, as magazine 72 is placed at the target location (e.g., a table surface or a chute) the progress of gripper assembly 200 is impeded. Cover 254 progresses to the extent allowed by slots 256 and 258, at which time a third projection 268 breaks the optical beam (shown by dashed and dotted lines) of second optical sensor 270. The breaking of the second optical beam causes hoist assembly 24 to stop and causes motor 214 to operate to release magazine 72.

Payload Identification

Gripper assembly 200 also provides the function of identifying magazines to the MTS controller. As best understood with reference to FIG. 9, gripper assembly 200 includes an optical reader 274, such as a bar code reader (BCR), which is positioned to view surfaces approaching bottom surface 219 of gripper housing 201. Each magazine 72 can have a bar code 270 or similar optically readable mark on top face 216 (FIG. 10). As bottom surface 219 of gripper housing 201 approaches magazine 72, optical reader 274 reads bar code 270. The identification data can be transmitted back to the central controller for processing and record keeping. This configuration is advantageous in that it allows magazines to be tracked during processing without having to have a BCR attached to each processing tool. A BCR 274 suitable for use with the present invention is commercially available from KEYENCE of Talawila, Wash.

Control System

Figure 13:
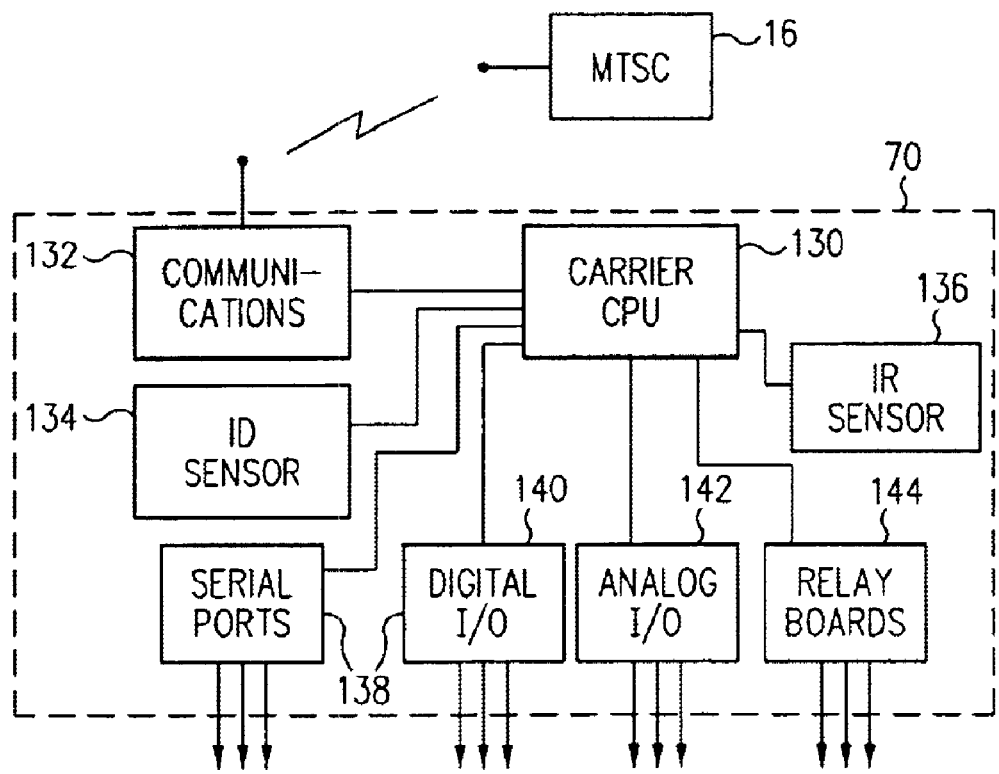
FIG. 13 is a block diagram of the control system of the present invention.

FIG. 13 is a simplified diagram of the control system of the present invention. In one embodiment, MTS 10 divides control responsibilities into two distinct functions. MTSC 16 manages the scheduling of vehicle events, while the vehicle controller (VC) 70 controls the vehicle actions. In this embodiment, MTSC 16 includes a central processing unit (CPU) or PC that may receive information from a factory mainframe (not shown.). MTSC 16 sends commands to VC 70, via an IR or RF communication link, to direct vehicle assembly 12 to service a particular processing tool. The directions may include, for example, routing information, track location, and service location and magazine identification data. MTSC 16 uses conventional control software for activating and monitoring various components of MTS 10, such as a software package available from Think and Do, headquartered in Ann Arbor, Mich.

As shown in FIG. 4A, vehicle controller 70 is an integrated machine control system that can be mounted on car platform 66. The movements or actions of vehicle assembly 12 are controlled using vehicle controller 70 and associated communication circuitry. Vehicle controller 70 provides the I/O, drivers, and power supplies needed to operate vehicle assembly 12, such as the operation of car carrier 60, hoist assembly 24 (e.g. start, stop, speed, and positioning), storage unit 68 and gripper assembly 200.

FIG. 13 shows a block diagram of MTSC 16 and vehicle controller 70. As shown in this embodiment, vehicle controller 70 includes a microprocessor or microcontroller 130 and associated communication circuitry 132, which effect communication to MTSC 16.

Each vehicle controller 70 also includes circuitry for establishing an identification designation or number 134 and for reporting the physical status of vehicle assembly 12, which can be communicated via the communication link to central controller 16. Optionally, an IR sensor 136 can be used for detecting objects or other cars present on the track to prevent collisions between vehicles.

Each vehicle controller 70 includes microprocessor 132 so that each vehicle assembly 12 can be controlled locally. However, in one embodiment, all vehicle controllers 70 can be coupled together via a local area network (LAN), to central controller 16. As described below, central controller 16 instructs vehicle controller 70 as to what actions to take at the approach of each specific processing tool. In MTS 10, vehicle controller 70 is responsible for developing the specific path that car carrier 60 will travel along track 26 to reach a specific processing tool.

Computer 130 communicates with various motors and motor controllers' car carrier 60 using an input/output (I/O) controller. Using the I/O controller, computer 130 can accommodate a variety of I/O boards including: (a) serial ports 138 for communicating with motors and motor controllers (e.g., motor 114 shown in FIG. 5A); (b) digital I/O 140 for controlling digital I/O lines, such as sensors; (c) analog I/O 142 for controlling analog signal activated devices; and (d) relay boards 144 for making or breaking continuity of signal lines.

Operational Embodiments

FIGS. 14A–E show embodiments of the operational process of the present invention. The functions performed by MTS 10 can be generalized as either a pick-up function; a transport function; and/or a load or placement function.

Figure 14A:
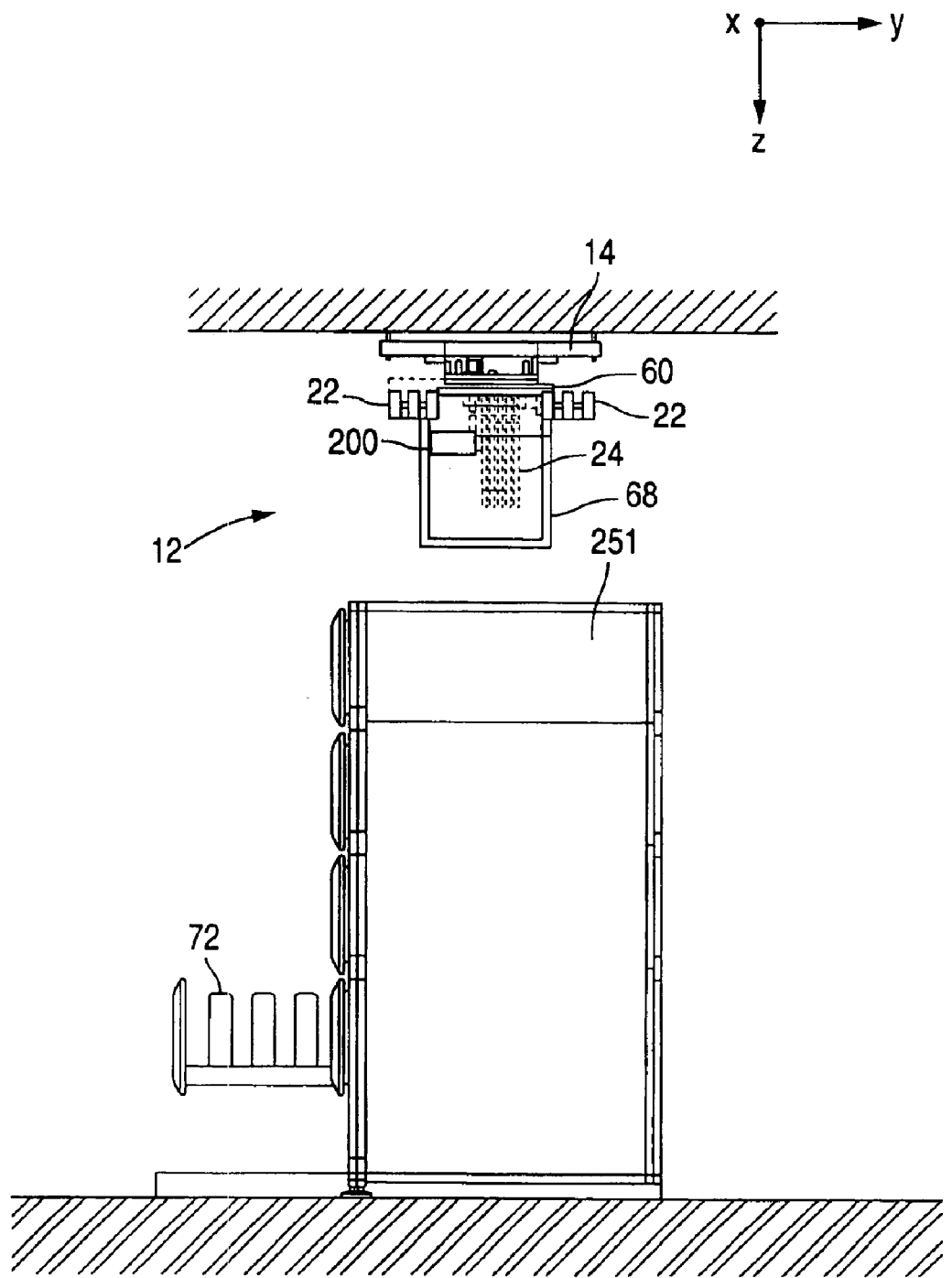
FIGS. 14A–14E are views of operational embodiments of the present invention.
Figure 14B:
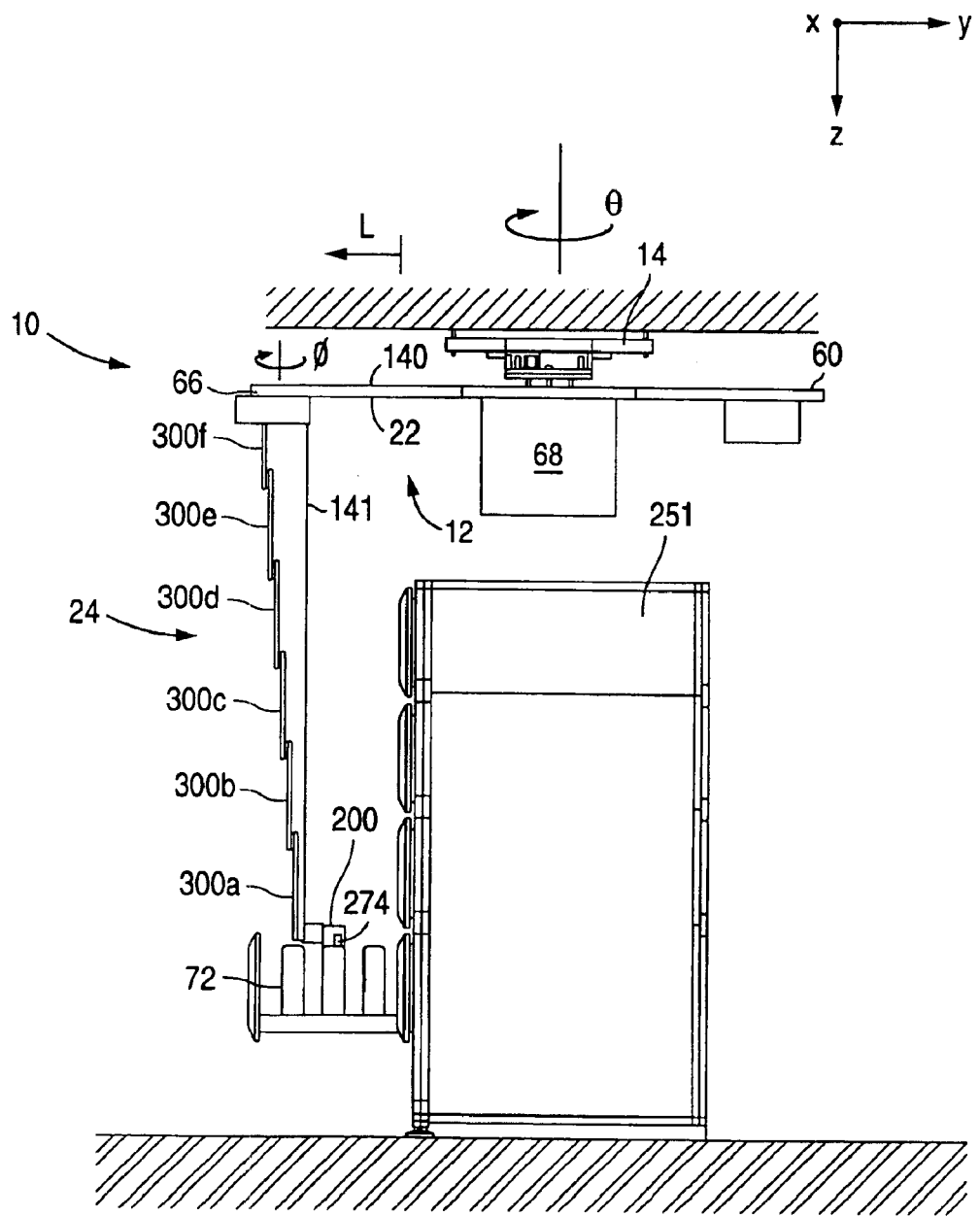
Figure 14C:
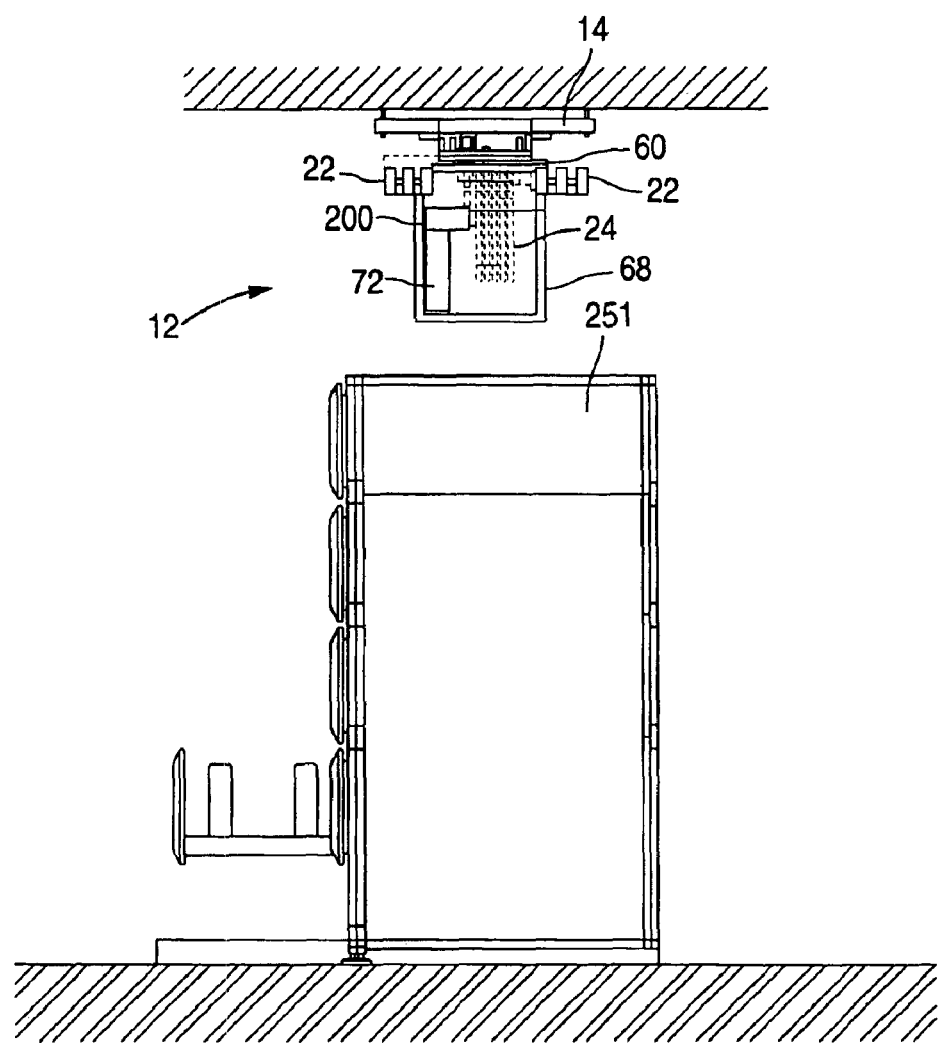
Figure 14D:
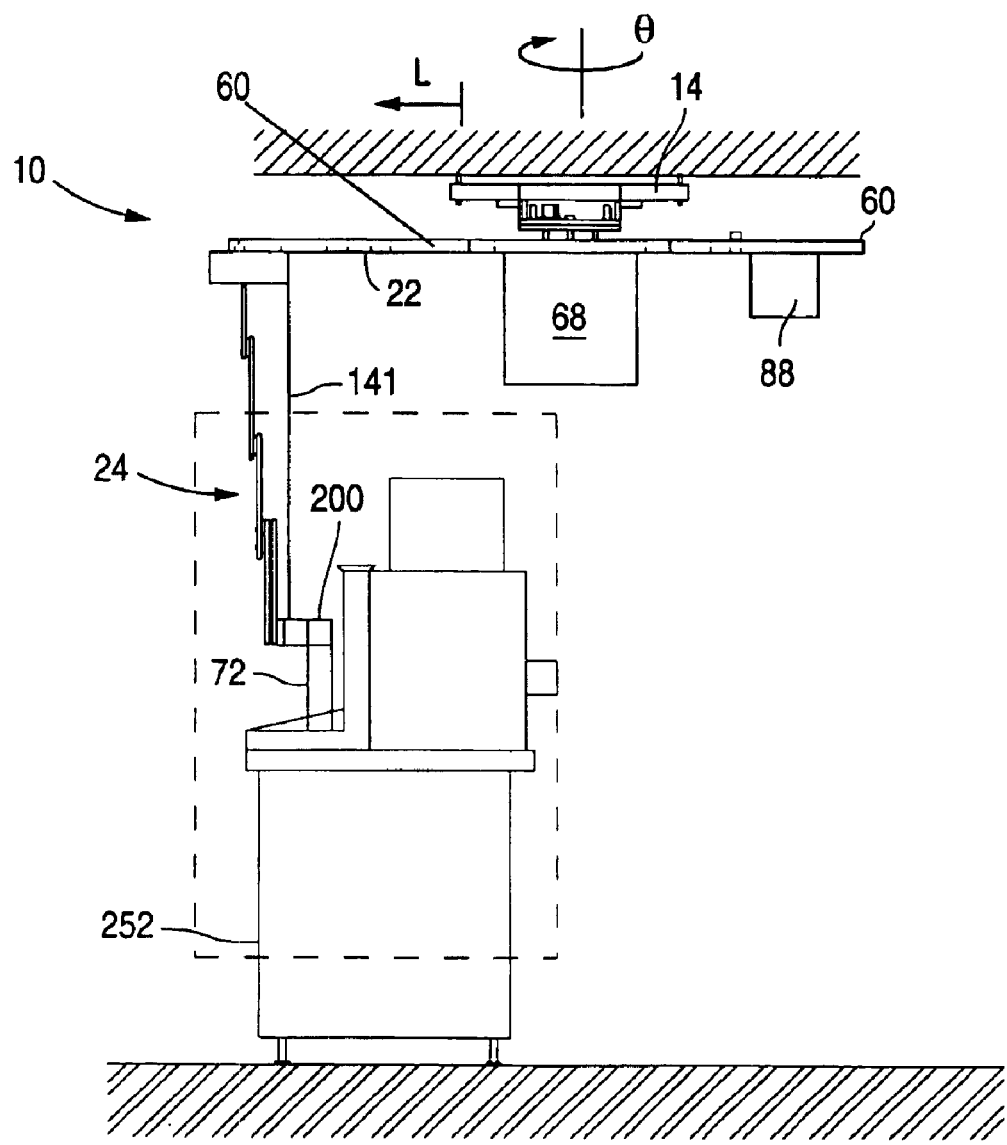

As shown in FIG. 14A, an operation may begin with moving vehicle assembly 12 of MTS 10 along rail system 14 to a position proximate to a magazine storage unit 251 or similar magazine storage device or a processing tool 252 (FIG. 14D).

As shown in FIG. 14B, car carrier 60 can be rotated an angle θ and extendible member assembly 22 can be extended a distance L, as needed, to position hoist assembly 24 over magazine 72. Car platform 66 can be rotated an angle φ to rotate hoist assembly 24 to orient gripper assembly 200 to pick-up (or deliver) magazine 72. Spooling mechanism 142 (FIG. 8A) releases belt 141, such that slide assemblies 300a–300f of extendible member 140 are permitted to slide relative to each other in the z-axis direction. The extended slide assemblies' position gripper assembly 200 over magazine 72, to grasp magazine 72 and remove it from magazine storage unit 251. Bar code reader 274 reads bar code 270 to identify magazine 72. Hoisting belt 141 can then be reeled up, causing slide assemblies 300a–300f to retract to their original configuration.

As shown in FIG. 14C, once magazine 72 has been reeled up, car carrier 60 can retract a distance L and rotate θ, such that centerline 76 of car carrier 60 is aligned along the x-axis. In this position, magazine 72 can be transported from storage unit 251 to any processing tool on the factory floor. Optionally, magazine 72 may be placed in storage unit 68, while vehicle assembly 12 services other processing tools. In this manner, vehicle assembly 12 provides greater transport efficiency by permitting vehicle assembly 12 to service more than one processing tool per transport cycle.

As shown in FIG. 14D, once vehicle assembly 12 arrives at processing tool 252, car carrier 60 is once again rotated an angle θ and extended a distance L, as needed, to place magazine 72 into position. In this embodiment, hoist assembly 24 lowers magazine 72 in the z-axis direction, such that gripper assembly 200 can place and release magazine 72 on the surface of processing tool 252.

Figure 14E:
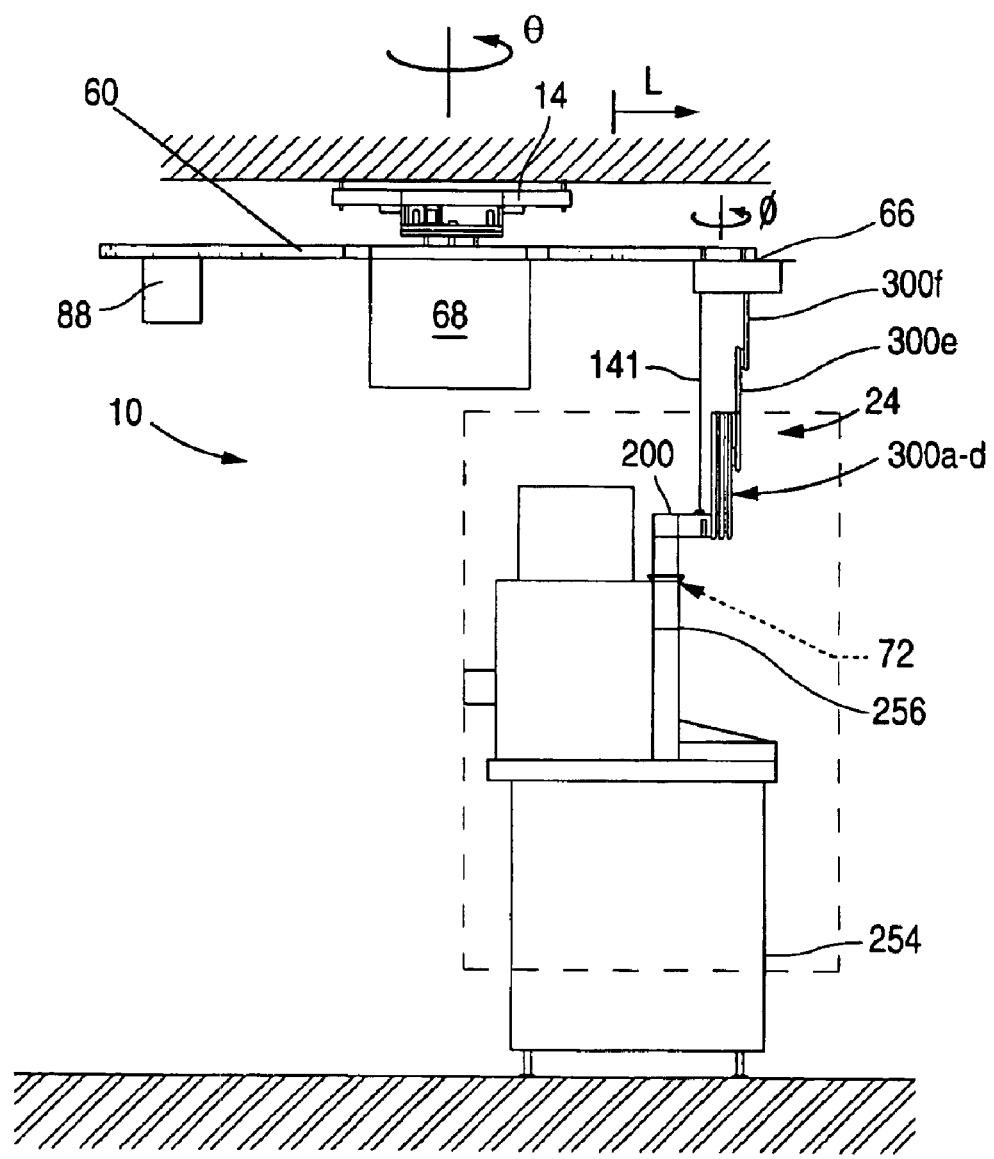

In an alternative embodiment, shown in FIG. 14E, car carrier 60 is rotated an angle θ and extended a distance L to position hoist assembly 24, gripper assembly 200, and magazine 72 over a chute loader 256 positioned on processing tool 254. Car platform 66 can be rotated an angle φ to ensure that magazine 72 is oriented properly to fit into chute 256. Slide assemblies 300a–300f are again made to extend in the z-axis direction until magazine 72 is properly within chute 256. Gripper assembly 200 then releases magazine 72 and hoist assembly 24 retracts.

It should be understood that in each of the above described embodiments, the operation of the hoist assembly 24 and gripper assembly 200 can be used to pick-up and remove magazine 72 from the surface of processing tool 252, as well as to pick-up and remove magazine 72 from chute 256.

The material transport system of the present invention is less complex than existing apparatus which use multi-track transport and transfer mechanisms, since the system of the present invention provides movement along only a passive, single rail system. MTS 10 makes possible higher machine throughput and improves positioning accuracy over other systems, because of the rigid hoist system and articulated gripper assembly designs. The present invention is operable in both vacuum and atmospheric processing environments.

The description of the invention given above is provided for purposes of illustration and is not intended to be limiting. The invention is set forth in the following claims.

What is claimed is:

1. A method for transporting material between various locations on a factory floor, said method comprising:

moving a rail mounted vehicle proximate to a first location;

actuating a material handling mechanism of the rail mounted vehicle to deploy a handling device for grasping material to be transported, wherein said material handling mechanism allows for horizontal, vertical, and rotational movement of the handling device relative to the rail mounted vehicle; and moving said material from said first location to a second location.

2. The method of claim 1, wherein said rail mounted vehicle comprises a communications system and a system controller, said method further comprising providing bi-directional communication between said system controller and said vehicle assembly.

3. The method of claim 2, wherein said communications system is taken from the group consisting of an infrared (IR) link and a radio frequency (RF) link.

4. The method of claim 1, wherein the method comprises assembling semiconductor chips into packages.

5. The method of claim 1, wherein said rail mounted vehicle is translatable over an overhead rail system.

6. The method of claim 5, wherein the method comprises assembling semiconductor chips into packages.

7. A method for carrying payloads between processing tools in a factory comprising:

providing a carrier coupled to an overhead rail system;

horizontally extending a first mechanism mounted on said carrier; and vertically extending a second mechanism mounted on said carrier;

grasping a payload;

rotating the first and second mechanisms relative to the carrier; and transporting said payload from a first location to a second location along said overhead rail system.

8. The method of claim 7, wherein said first mechanism comprises an external member and an internal member operatively coupled to each other and said carrier, wherein said external member and said carrier are configured to move relative to said internal member in opposite directions to cause said second mechanism to move away from a center of said support frame.

9. The method of claim 7, wherein said second mechanism comprises a plurality of slidably engaged members, wherein said slidably engaged members provide a rigid positional platform when vertically extended.

10. The method of claim 8, wherein said second mechanism comprises a gripper assembly.

11. The method of claim 7, wherein grasping the payload comprises:
    actuating a gripper mechanism to grasp said payload; and
    raising said gripper mechanism to move said payload to be in contact with a gripper housing.

12. The method of claim 11, further comprising depressing a trigger mechanism to cause said gripper mechanism to release said payload.

13. The method of claim 11, further comprising depressing a trigger mechanism to cause said gripper mechanism to hold said payload.

14. The method of claim 7, wherein the method comprises assembling semiconductor chips into packages.

15. The method of claim 7, wherein said payload is a semiconductor chip magazine.

16. The method of claim 7, wherein said first mechanism is horizontally slidable between an extended position and a non-extended position; and said second mechanism is vertically slidable between a raised position and a lowered position.

17. A method for transporting materials comprising:
    moving a vehicle assembly along an overhead rail system to a position proximate to a target location;
    horizontally extending an extendible member assembly to position a hoist assembly over said target location;
    rotating said extendible member assembly to orient said hoist assembly over said target location; and
    vertically extending said hoist assembly for picking-up or placing a payload at said target location.

18. The method of claim 17, wherein the method comprises assembling semiconductor chips into packages.

19. The method of claim 17, wherein said hoist assembly comprises a plurality of slidably engaged members.

20. The method of claim 19, wherein vertically extending said hoist assembly comprises spooling a belt to allow said slidably engaged members to slide relative to each other in the vertical direction.

21. The method of claim 17, wherein vertically extending said hoist assembly comprises positioning a gripper assembly proximate to said payload to pick up said payload from said target location.

22. The method of claim 17, wherein vertically extending said hoist assembly comprises positioning a gripper assembly proximate to said payload to place said payload at said target location.

23. The method of claim 17, wherein said payload is a semiconductor chip magazine.

24. The method of claim 17 further comprising grasping said payload and transporting said payload from a first position to a second position.

25. The method of claim 24, further comprising placing said payload in a storage unit during said transporting.

26. The method of claim 17, wherein vertically extending said hoist assembly comprises picking up or placing said payload into a chute loader positioned on a processing tool.

27. A method for carrying payloads between processing tools in a factory comprising:
    providing a carrier coupled to an overhead rail system;
    horizontally extending a first mechanism mounted on said carrier; and
    vertically extending a second mechanism mounted on said carrier;
    grasping a payload; and
    transporting said payload from a first location to a second location along said overhead rail system;
    wherein said first mechanism comprises an external member and an internal member operatively coupled to each other and said carrier, and wherein said external member and said carrier are configured to move relative to said internal member in opposite directions to cause said second mechanism to move away from a center of said support frame.

28. The method of claim 27, wherein the method comprises assembling semiconductor chips into packages.

29. A method for carrying payloads between processing tools in a factory comprising:
    providing a carrier coupled to an overhead rail system;
    horizontally extending a first mechanism mounted on said carrier; and
    vertically extending a second mechanism mounted on said carrier;
    grasping a payload; and
    transporting said payload from a first location to a second location along said overhead rail system;
    wherein grasping the payload comprises:
    actuating a gripper mechanism to grasp said payload; and
    raising said gripper mechanism to move said payload to be in contact with a gripper housing.

30. The method of claim 29, further comprising depressing a trigger mechanism to cause said gripper mechanism to release said payload.

31. The method of claim 29, further comprising depressing a trigger mechanism to cause said gripper mechanism to hold said payload.

32. The method of claim 29, wherein the method comprises assembling semiconductor chips into packages.

33. The method of claim 30, wherein the method comprises assembling semiconductor chips into packages.

34. The method of claim 31, wherein the method comprises assembling semiconductor chips into packages.

35. A method for transporting materials comprising:
    moving a vehicle assembly along an overhead rail system to a position proximate to a target location;
    horizontally extending an extendible member assembly to position a hoist assembly over said target location, wherein said hoist assembly comprises a plurality of slidably engaged members; and
    vertically extending said hoist assembly for picking-up or placing a payload at said target location, wherein vertically extending said hoist assembly comprises spooling a belt to allow said slidably engaged members to slide relative to each other in the vertical direction.

36. The method of claim 35, wherein the method comprises assembling semiconductor chips into packages.

37. A method for transporting materials comprising:
    moving a vehicle assembly along an overhead rail system to a position proximate to a target location;

horizontally extending an extendible member assembly to position a hoist assembly over said target location;

vertically extending said hoist assembly for picking-up or placing a payload at said target location;

grasping said payload and transporting said payload from a first position to a second position; and placing said payload in a storage unit during said transporting.

38. The method of claim 37, wherein the method comprises assembling semiconductor chips into packages.

* * * * *